(12) United States Patent
Fukuda

(10) Patent No.: US 8,179,021 B2
(45) Date of Patent: May 15, 2012

(54) PIEZOELECTRIC RESONATOR WITH CONTROL FILM TO INCREASE A DEGREE OF VACUUM INSIDE THE PACKAGE

(75) Inventor: Junya Fukuda, Chiba (JP)

(73) Assignee: Seiko Instruments Inc., Chiba (JP)

(*) Notice: Subject to any disclaimer, the term of this patent is extended or adjusted under 35 U.S.C. 154(b) by 71 days.

(21) Appl. No.: 12/852,120

(22) Filed: Aug. 6, 2010

(65) Prior Publication Data

US 2010/0301954 A1 Dec. 2, 2010

Related U.S. Application Data

(63) Continuation of application No. PCT/JP2008/069109, filed on Oct. 22, 2008.

(30) Foreign Application Priority Data

Feb. 16, 2008 (JP) ................................. 2008-035382
Jun. 23, 2008 (JP) ................................. 2008-163492

(51) Int. Cl.
*H01L 41/08* (2006.01)
*H03H 9/19* (2006.01)

(52) U.S. Cl. .......................... 310/344; 310/312; 310/370
(58) Field of Classification Search .................. 310/312, 310/344, 348, 370
See application file for complete search history.

(56) References Cited

U.S. PATENT DOCUMENTS

| | | | | |
|---|---|---|---|---|
| 4,050,126 A | * | 9/1977 | Ikeno et al. | ............ 29/25.35 |
| 6,924,582 B2 | * | 8/2005 | Shimizu et al. | ............ 310/312 |
| 7,946,008 B2 | * | 5/2011 | Shimizu et al. | ............ 29/25.35 |
| 2003/0168944 A1 | | 9/2003 | Shimizu et al. | |
| 2010/0237739 A1 | * | 9/2010 | Ouchi et al. | ............ 310/312 |
| 2010/0301954 A1 | * | 12/2010 | Fukuda | ............ 331/116 R |
| 2011/0018398 A1 | * | 1/2011 | Fukuda | ............ 310/344 |

(Continued)

FOREIGN PATENT DOCUMENTS

| | | |
|---|---|---|
| JP | 53-149794 A | 12/1978 |
| JP | 2003-133879 A | 5/2003 |
| JP | 2003-142976 A | 5/2003 |
| JP | 2006-086585 A | 3/2006 |
| JP | 2007-267101 A | 10/2007 |

OTHER PUBLICATIONS

International Search Report for International Application No. PCT/JP2008/069109, dated Nov. 25, 2008, 1 page.

*Primary Examiner* — J. San Martin
(74) *Attorney, Agent, or Firm* — Brinks Hofer Gilson & Lione

(57) ABSTRACT

Provided are: a piezoelectric oscillation piece which has a pair of oscillation arms disposed in parallel with each other with base ends of the oscillation arms fixed to a base of the piezoelectric oscillation piece and with weight metal films formed at the tips of the oscillation arms; a base substrate on the upper surface of which the piezoelectric oscillation piece is mounted; a lid substrate joined with the base substrate such that the mounted piezoelectric oscillation piece can be accommodated in a cavity; and a control film disposed in the vicinity of the pair of oscillation arms as viewed in the plan view and formed at least on either of the substrates in such a manner as to extend from the base end side to the tip side in the longitudinal direction of the oscillation arms for increasing the degree of vacuum inside the cavity by heating. The control film is locally deposited on the side surfaces of the oscillation arms in the vicinity of the control film by heating.

16 Claims, 26 Drawing Sheets

U.S. PATENT DOCUMENTS

| | | | |
|---|---|---|---|
| 2011/0025166 A1* | 2/2011 | Aratake | 310/312 |
| 2011/0050043 A1* | 3/2011 | Sugiyama | 310/344 |
| 2011/0140794 A1* | 6/2011 | Fukuda | 331/158 |
| 2011/0140796 A1* | 6/2011 | Fukuda | 331/158 |
| 2011/0164473 A1* | 7/2011 | Onitsuka et al. | 368/47 |
| 2011/0169584 A1* | 7/2011 | Fukuda | 331/158 |

* cited by examiner

FREQUENCY CHANGE BEFORE AND AFTER GETTERING

PIEZOELECTRIC RESONATOR WITH CONTROL FILM TO INCREASE A DEGREE OF VACUUM INSIDE THE PACKAGE

RELATED APPLICATIONS

This application is a continuation of PCT/JP2008/069109 filed on Oct. 22, 2008, which claims priority to Japanese Application Nos. 2008-035382 filed on Feb. 16, 2008 and 2008-163492 filed on Jun. 23, 2008. The entire contents of these applications are incorporated herein by reference.

FIELD OF THE INVENTION

The present invention relates to a surface mount device (SMD) piezoelectric transducer which has a piezoelectric oscillation piece sealed into a cavity formed between two joined substrates, a piezoelectric transducer manufacturing method for manufacturing the piezoelectric transducer, and an oscillator, an electronic device, and a radio clock each of which includes the piezoelectric transducer.

BACKGROUND OF THE INVENTION

Recently, a piezoelectric transducer containing crystal or the like as a time source, a timing source for generating control signals and others, or a reference signal source, for example, has been used in a cellular phone and a portable information terminal device. Various types of piezoelectric transducer for this purpose are known, and a surface mount device piezoelectric transducer is an example of these. A typical piezoelectric transducer of this type has three-layer structure constituted by a piezoelectric substrate containing a piezoelectric oscillation piece, a base substrate, and a lid substrate joined with one another in the up-down direction with the piezoelectric substrate sandwiched between the base substrate and the lid substrate. According to this structure, the piezoelectric transducer is accommodated in a cavity (closed chamber) formed between the base substrate and the lid substrate.

Moreover, a two-layer structure type has been developed in more recent years as well as the three-layer structure type discussed above. This piezoelectric transducer has two-layer structure having the base structure and the lid structure directly connected with each other, and the piezoelectric oscillation piece is accommodated in the cavity formed between the two substrates. This two-layer structure type piezoelectric transducer is superior to the three-layer structure type in its smaller thickness and other points, and thus has been used as preferable art.

A tuning-fork-type piezoelectric oscillation piece is known as the piezoelectric oscillation piece accommodated in the cavity. This turning-fork-type piezoelectric oscillation piece has a pair of oscillation arms disposed in parallel, and a base for fixing the base ends of the pair of the oscillation arms as one unit. When predetermined drive voltage is applied to the pair of the oscillation arms, the oscillation arms oscillate in the direction of moving close to each other or away from each other. It is known that a frequency F during oscillation is calculated by $F=k(W/L^2)$, assuming that the arm length of each oscillation arm (length in the longitudinal direction) is L and that the arm width is W (in equation, k is a proportional constant).

Generally, a piezoelectric transducer has a determined nominal frequency as a secured frequency during oscillation of a piezoelectric oscillation piece to which predetermined drive voltage is applied. Thus, the frequency of the piezoelectric oscillation piece needs to be controlled in such a manner as to oscillate within the nominal frequency when voltage is applied.

For this purpose, frequency control of the piezoelectric oscillation piece is performed. Generally, the frequency control is divided into two stages of rough control and fine control. The rough control step is conducted during the production process of the piezoelectric oscillation piece as a step for rough frequency control, in which step the frequency comes close to the nominal frequency to some extent. The fine control step is performed after the piezoelectric oscillation piece is sealed into the cavity as a step for fine frequency control, in which step the piezoelectric oscillation piece can finally oscillate within the range of the nominal frequency. The fine control step is particularly an important step which can determine the quality of the piezoelectric oscillation piece.

The fine control step is generally executed by heating a weight metal film formed on the outer surface of the oscillated piezoelectric oscillation piece using laser or the like while measuring the frequency to partially remove the weight metal film (for example, see Patent Reference 1). According to this method, the weight of the piezoelectric oscillation piece is slightly reduced by removing the weight metal film. As a result, the frequency of the piezoelectric oscillation piece increases. Thus, the frequency of the piezoelectric oscillation piece can be gradually raised (adjusted) such that the frequency can approach the nominal frequency.

During manufacture of the piezoelectric transducer, there is also a process for controlling series resonance resistance (R1) by increasing the degree of vacuum inside the cavity as an important process similarly to the frequency control explained above. The series resonance resistance depends on the degree of vacuum inside the cavity. More specifically, the series resonance resistance lowers to approach appropriate resistance until the degree of vacuum inside the cavity reaches a certain level, and the resistance does not greatly vary after the degree of vacuum comes equal to or higher than the constant level. The degree of vacuum inside the cavity is a factor having effect on the frequency of the piezoelectric oscillation piece. Thus, the series resonance resistance needs to be adjusted to appropriate resonance serial resistance before the fine control step.

For example, the series resonance resistance can be controlled by using a getter member made of aluminum or the like inside the cavity as a known method (for example, see Patent Reference 2 and Patent Reference 3). According to this method, the getter member is initially heated by laser or the like for activation. Then, the activated getter member absorbs the air inside the cavity while evaporating. As a result, the degree of vacuum inside the cavity increases, thereby controlling the series resonance resistance. The method of controlling the series resonance resistance by increasing the degree of vacuum is hereinafter referred to as gettering.

Thus, in manufacturing the surface mount device piezoelectric transducer, it is considered that the processes of sealing the piezoelectric oscillation piece into the cavity and then performing gettering and fine control are essential for maintaining the quality of the product.

FIG. 29 is a plan view illustrating a condition of a piezoelectric transducer from which a lid substrate is removed according to related art. FIG. 30 is a cross-sectional view taken along a line D-D in FIG. 29. As illustrated in FIG. 30, a surface mount device piezoelectric transducer 200 which includes a package 209 constituted by a base substrate 201 and a lid substrate 202, and a piezoelectric oscillation piece 203 accommodated in a cavity C formed inside the package 209 has been proposed. A junction film 207 is disposed between the base substrate 201 and the lid substrate 202 to join both the substrates 201 and 202 by anode junction.

It is generally demanded that the piezoelectric transducer has lowest possible equivalent resistance (effective resistance Re). The piezoelectric transducer having low equivalent resistance can oscillate the piezoelectric oscillation piece by low power as a piezoelectric transducer achieving high energy efficiency.

For reducing equivalent resistance, the interior of the cavity C into which the piezoelectric oscillation piece 203 is sealed is brought into a condition close to vacuum as illustrated in FIG. 29 as a typical known method. For bringing the interior of the cavity C close to vacuum, a method of sealing getter members 210 such as aluminum into the cavity C and applying laser to the getter members 220 from outside to activate the getter members 220 (gettering) is known (for example, see Patent References 2 and 3). According to this method, oxygen generated at the time of anode junction can be absorbed by the activated getter members 210, and thus the interior of the cavity C can be brought into a condition close to vacuum.

Patent Reference 1: JP-A-2003-133879
Patent Reference 2: JP-A-2006-86585
Patent Reference 3: JP-T-2007-511102

However, the following problems still arise from the piezoelectric transducer manufacturing method described above.

During initial heating of the weight metal film in the fine control step, the piezoelectric oscillation piece on which the weight metal film is formed is heated as well. In this case, the piezoelectric oscillation piece inevitably receives heating load. Thus, it is desired that the fine control step is performed producing the lowest possible load. However, since variations in the film thickness of the weight metal film are easily produced, a heating load is easily given to the piezoelectric oscillation piece. That is, due to the variations in the film thickness, frequency change differs every time one pulse of laser is applied. In this case, an unexpected and unintended amount of weight metal film is removed due to variations of the film thickness even when the expected amount of the weight metal film is desired to be removed by applying one pulse of laser. As a result, frequency change varies. Thus, laser needs to be repeatedly applied to the piezoelectric oscillation piece in some cases, which may accumulate heating loads on the piezoelectric oscillation piece and give adverse effect on the piezoelectric oscillation piece.

Particularly, since the removed weight metal film cannot be returned to the original state, the frequency increased once cannot be returned to a lower frequency. Thus, removal of the weight metal film needs to be carefully carried out little by little, which easily accumulates heating loads on the piezoelectric oscillation piece and gives adverse effect on the piezoelectric oscillation piece with high possibility.

Moreover, the steps of gettering and fine control essential to maintenance of the quality are separately performed at different times. In this case, a long time is required to manufacture the piezoelectric transducer, which lowers working efficiency.

The invention has been developed considering these circumstances. It is an object of the invention to provide a surface mount device piezoelectric transducer capable of performing fine frequency control with higher accuracy while reducing accumulation of heating loads as much as possible and performing gettering and fine control with high efficiency. It is another object of the invention to provide a piezoelectric transducer manufacturing method for manufacturing the piezoelectric transducer, an oscillator, an electronic device, and a radio clock each of which includes the piezoelectric transducer.

For controlling the frequency of the piezoelectric transducer 200 including the tuning-fork-type piezoelectric oscillation piece 203 shown in FIG. 29, such a method is known which attaches metal weight members 211 for frequency control to the tips of the oscillation arms 210 of the piezoelectric oscillation piece 203 and partially fuses and removes the weight members 211 by applying laser beam for trimming such that the mass of the weight members 211 can be reduced (for example, see Patent Reference 1).

According to the related-art frequency control method, the mass of the oscillation arms 210 is reduced by trimming the weight members 211. Thus, frequency control can only increase the frequency of the piezoelectric transducer 200. In this case, when the frequency of the piezoelectric transducer 200 exceeds a target value by excessively trimming the weight members 211, the piezoelectric transducer 200 needs to be thrown away for the absence of the method of decreasing the frequency to the target value. Accordingly, the yield of the piezoelectric transducer 200 unfortunately lowers.

SUMMARY OF THE INVENTION

The invention has been developed considering the problems described above. It is an object of the invention to provide a piezoelectric transducer and a method for manufacturing the piezoelectric transducer capable of improving yield of the piezoelectric transducer.

The invention provides the following means for solving the problems.

A piezoelectric transducer according to the invention is characterized by including: a piezoelectric oscillation piece which has a pair of oscillation arms disposed in parallel with each other with base ends of the oscillation arms fixed to a base of the piezoelectric oscillation piece and with weight metal films formed at the tips of the oscillation arms; a base substrate on the upper surface of which the piezoelectric oscillation piece is mounted; a lid substrate joined with the base substrate such that the mounted piezoelectric oscillation piece can be accommodated in a cavity; and a control film disposed in the vicinity of the pair of the oscillation arms as viewed in the plan view and formed at least on either of the substrates in such a manner as to extend from the base end side to the tip side in the longitudinal direction of the oscillation arms for increasing the degree of vacuum inside the cavity by heating. The control film is locally deposited on the side surfaces of the oscillation arms in the vicinity of the control film by the heating.

A piezoelectric transducer manufacturing method according to the invention is a method for manufacturing a piezoelectric transducer which includes a piezoelectric oscillation piece having a pair of oscillation arms disposed in parallel with each other with base ends of the oscillation arms fixed to a base of the piezoelectric oscillation piece and with weight metal films formed at the tips of the oscillation arms, a base substrate on the upper surface of which the piezoelectric oscillation piece is mounted, a lid substrate joined with the base substrate such that the mounted piezoelectric oscillation piece can be accommodated in a cavity, and a control film disposed in the vicinity of the pair of the oscillation arms as viewed in the plan view and formed at least on either of the substrates in such a manner as to extend from the base end side to the tip side in the longitudinal direction of the oscillation arms for increasing the degree of vacuum inside the cavity by heating. The method is characterized by including:

a control film forming step which forms the control film at least on either the base substrate or the lid substrate; a joining step which joins the base substrate and the lid substrate after mounting the piezoelectric oscillation piece on the upper surface of the base substrate to seal the piezoelectric oscillation piece into the cavity; a gettering step which locally heats and evaporates the control film while measuring series resonance resistance and a frequency after oscillating the piezoelectric oscillation piece sealed in the cavity to adjust the degree of vacuum inside the cavity to a certain level or higher and also adjust the frequency to a value lying within an approximate range around a target value; and a fine control step which performs fine control of the frequency within the approximate range by heating the weight metal films while continuously measuring the frequency to adjust the frequency to a value close to the target value. In the gettering step, the heating position of the control film is determined according to the difference between the approximate range and the measured frequency. Oscillation characteristics are changed by locally depositing the heated control film on the side surfaces of the oscillation arms positioned in the vicinity of the heating position.

According to the piezoelectric transducer and the piezoelectric transducer manufacturing method of the invention, the control film forming step which forms the control film for increasing the degree of vacuum inside the cavity by heating the control film at least on either the base substrate or the lid substrate is performed. In this case, the control film is disposed in the vicinity of the pair of the oscillation arms as viewed in the plan view in such a manner as to extend from the base ends to the tips of the oscillation arms in the longitudinal direction of the oscillation arms. The plan view herein refers to observation of the piezoelectric transducer from the upper surface or the lower surface such that the piezoelectric oscillation piece can be projected on the base substrate or the lid substrate.

Then, after the piezoelectric transduction piece is mounted on the upper surface of the base substrate, the joining step for joining the base substrate and the lid substrate is performed. By this step, the piezoelectric oscillation piece can be sealed into the cavity.

Then, the gettering step for locally heating and evaporating the control film while measuring the series resonance resistance is performed after oscillation of the piezoelectric oscillation piece sealed into the cavity to adjust the degree of vacuum inside the cavity to the certain level or higher. The certain level refers to a level above which the series resonance resistance does not considerably vary. By this step, proper series resonance resistance can be secured.

In the gettering step, the frequency is adjusted to a value lying within the approximate range around the target value by using the control film while measuring the frequency as well as control of the degree of vacuum inside the cavity. The target value herein refers to the nominal frequency of the piezoelectric transducer for securing the quality.

The frequency control method during the gettering step is herein described. Initially, the control film is formed adjacent to the pair of the oscillation arms as viewed in the plan view. When the control film is heated and evaporated, the control film is locally deposited on the surfaces of the oscillation arms located in the vicinity of the heating position. In this condition, the frequency tends to increase when the deposition position of the control film is on the base end side of the oscillation arms, and decrease when the deposition position is on the tip side. Thus, the frequency can be increased or decreased by changing the heating position of the control film. According to this method, therefore, the oscillation characteristics of the oscillation arms can be changed by determining the heating position of the control film according to the difference between the approximate range and the actually measured frequency and by locally depositing the evaporated control film on the side surfaces of the oscillation arms. Accordingly, the frequency of the pair of the oscillation arms can be adjusted to a value lying within the approximate range around the target value simultaneously with gettering.

As can be understood, both advantages of securing proper series resonance resistance and adjusting the frequency to a value lying within the approximate range in advance can be provided by the gettering step. The degree of vacuum inside the cavity is not affected by the heating position of the control film.

Then, the fine control step for performing fine control of the frequency within the approximate range by heating the weight metal films while continuously measuring the frequency to adjust the frequency to a value close to the target value is performed. By this step, the frequency of the piezoelectric oscillation piece can be adjusted to the nominal frequency as the target value.

As a result, the surface mount device piezoelectric transducer including the piezoelectric oscillation piece within the cavity formed between the base substrate and lid substrate joined to each other can be manufactured.

Particularly in related-art technology which relies on the weight metal films for frequency control, the weight metal films having variances in the film thickness need to be repeatedly and carefully removed. According to the invention, however, the frequency is already adjusted to a value lying within the approximate range of the target value before the fine control step, and thus the weight metal films are removed only slightly. Therefore, fine control can be performed with high accuracy in a shorter time without considerably affected by the variances of the film thickness. Accordingly, the quality can be improved. Moreover, since the necessity for repeatedly heating the weight metal films is eliminated unlike the related art, accumulation of heating loads can be prevented. Thus, the quality of the piezoelectric transducer can be improved in this aspect.

Furthermore, since the gettering and fine control performed at different times in the related art can be simultaneously performed, the manufacturing process can be simplified. Thus, the manufacture efficiency can be increased.

The piezoelectric transducer according to the invention is characterized in that the control film is sandwiched between the pair of the oscillation arms as viewed in the plan view.

The piezoelectric transducer manufacturing method according to the invention is characterized in that the control film is formed in such a condition as to be sandwiched between the pair of the oscillation arms as viewed in the plan view in the control film forming step.

According to the piezoelectric transducer and the piezoelectric transducer manufacturing method of the invention, the control film is formed in such a condition as to be sandwiched between the pair of the oscillation arms as viewed in the plan view in the control film forming step. That is, the control film is disposed in the vicinity of both the pair of the oscillation arms. Thus, the control film can be deposited on both the side surfaces of the pair of the oscillation arms by heating only one point of the control film. That is, the necessity for forming a pair of the control films in such positions as to be located adjacent to each of the pair of the oscillation arms and heating the pair of the control films is eliminated. Accordingly, the manufacture process can be further simplified.

A piezoelectric transducer manufacturing method according to the invention is a method for manufacturing a piezoelectric transducer which includes a tuning-fork type piezoelectric oscillation piece having a pair of oscillation arms, a package containing the piezoelectric oscillation piece, and a first mass control film formed on the oscillation arms, wherein the frequency of the piezoelectric oscillation piece can be increased by removing a part of the first mass control film. The method is characterized in that: a second mass control film is formed inside the package in the vicinity of the first mass control film; and a step for decreasing the frequency of the piezoelectric oscillation piece by removing at least a part of the second mass control film in an area in the vicinity of the first mass control film is performed.

When a part of the first mass control film is removed, the frequency of the piezoelectric oscillation piece is increased. Thus, when a substance adheres to the forming section of the first mass control film, the frequency of the piezoelectric oscillation piece lowers. According to the invention, the second mass control film in the area adjacent to the first mass control film is removed. In this case, the product produced by removal adheres to the forming section of the first mass control film, and thus the frequency of the piezoelectric oscillation piece can be decreased. By this method, the frequency of the piezoelectric transducer can be adjusted to a value lying within the target range by removing the second mass control film even when the frequency of the piezoelectric transducer exceeds the target range by excessive removal of the first mass control film. Accordingly, the yield of the piezoelectric transducer can be increased.

It is preferable that removal of the second mass control film is achieved by applying laser from outside the package.

According to this structure, the second mass control film can be removed similarly to the removal of the first mass control film. Thus, frequency control of the piezoelectric transducer can be easily conducted.

It is preferable that the package is formed by joining a pair of substrates by anode junction via a junction film, and that a step for simultaneously forming the junction film and the second mass control film is performed.

According to this structure, the manufacture process can be simplified, and the manufacture cost can be reduced.

A piezoelectric transducer which includes a tuning-fork type piezoelectric oscillation piece having a pair of oscillation arms, a package containing the piezoelectric oscillation piece, and a first mass control film formed on the oscillation arms, and capable of increasing the frequency of the piezoelectric oscillation piece by removing a part of the first mass control film according to the invention is characterized in that: a second mass control film is formed inside the package in the vicinity of the first mass control film, and at least a part of the second mass control film in an area in the vicinity of the first mass control film is removed.

The piezoelectric transducer according to the invention is further characterized in that at least a part of product produced by removal of the second mass control film adheres to the forming section of the first mass control film in the length direction of the oscillation arms.

According to these structures, frequency control is performed such that the frequency of the piezoelectric oscillation piece decreases. Thus, the yield of the piezoelectric transducer can be improved.

It is preferable that the second mass control film is a getter member.

According to this structure, the necessity for forming the second mass control film separately from the getter member is eliminated. Thus, the cost of the piezoelectric transducer can be reduced.

An oscillator according to the invention is characterized by including the piezoelectric transducer according to the invention described above electrically connected with an integrated circuit as oscillation unit.

An electronic device according to the invention is characterized by including the piezoelectric transducer according to the invention described above electrically connected with a timer unit.

A radio clock according to the invention is characterized by including the piezoelectric transducer according to the invention described above electrically connected with a filter unit.

Each of the oscillator, the electronic device, and the radio clock according to the invention includes the piezoelectric transducer which has quality increased by performing frequency fine control with higher accuracy while reducing accumulation of heating load and achieves cost reduction by performing gettering and fine control with high efficiency. Thus, quality improvement and cost reduction can be similarly achieved.

Moreover, cost reduction of the oscillator, the electronic device, and the radio clock can be achieved by including the piezoelectric transducer having higher yield.

The piezoelectric transducer according to the invention is the surface mount device piezoelectric transducer which has quality increased by performing frequency fine control with higher accuracy while reducing accumulation of heating load and achieves cost reduction by performing gettering and fine control with high efficiency.

The piezoelectric transducer manufacturing method according to the invention can manufacture the piezoelectric transducer described above.

According to the piezoelectric transducer manufacturing method of the invention, the frequency of the piezoelectric oscillation piece can be lowered by removing the second mass control film. Thus, the frequency of the piezoelectric transducer can be adjusted to a value lying within the target range by removing the second mass control film even when the frequency of the piezoelectric transducer exceeds the target range by excessive removal of the first mass control film. Accordingly, the yield of the piezoelectric transducer can be increased.

Moreover, the quality of the oscillator, the electronic device, and the radio clock according to the invention can be improved and the cost thereof can be decreased by including the piezoelectric transducer as described above.

DETAILED DESCRIPTION OF THE PREFERRED EMBODIMENTS

[First Embodiment]

Figure 1:
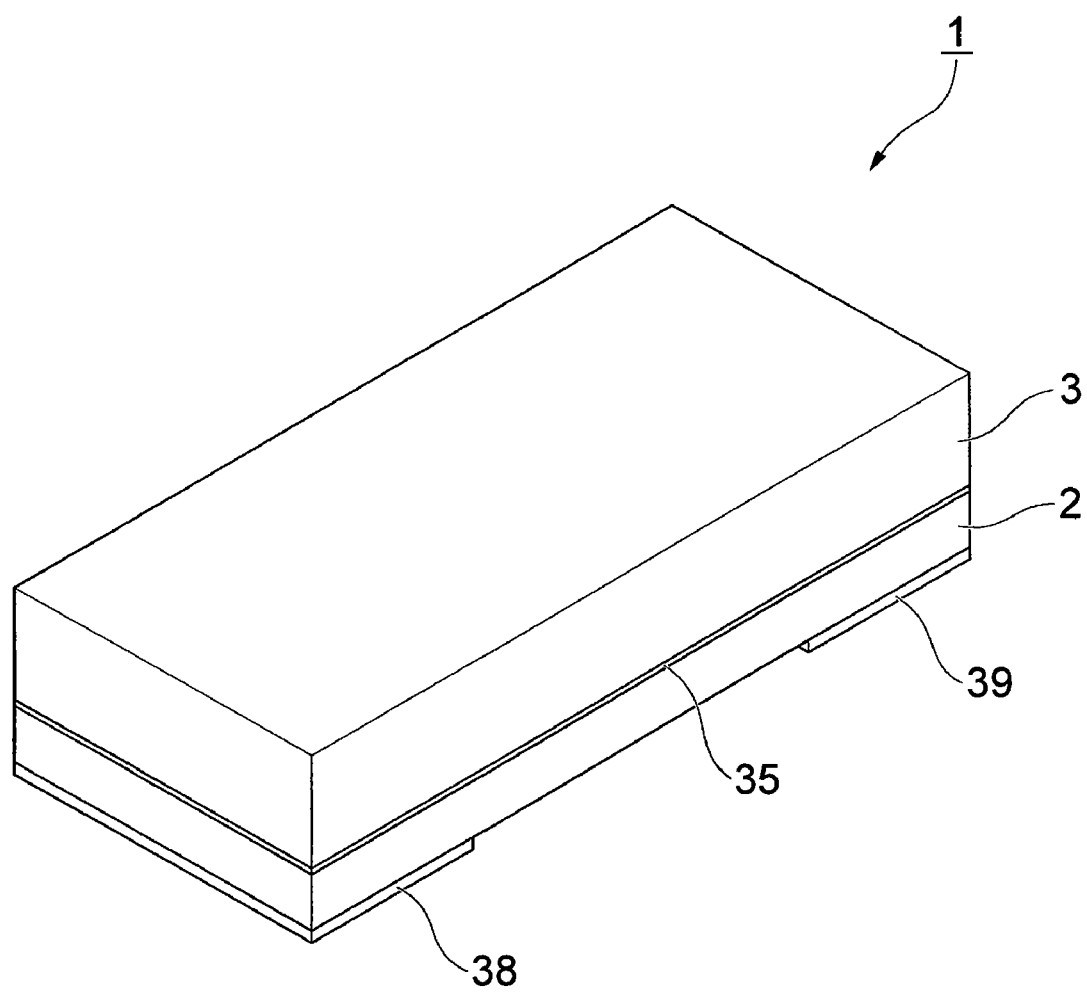
FIG. 1 is a perspective view illustrating an external appearance of a piezoelectric transducer according to a first embodiment of the invention.

A first embodiment of the invention is hereinafter described with reference to FIGS. 1 through 13.

As illustrated in FIGS. 1 through 4, a piezoelectric transducer 1 according to this embodiment is a box-shaped device which has laminated two-layer structure constituted by a base substrate 2 and a lid substrate 3 as a surface mount device piezoelectric transducer containing a piezoelectric oscillation piece 4 in a cavity C formed inside the piezoelectric transducer 1.

For easy understanding of the figure, FIG. 4 does not show oscillation electrodes 15, extension electrodes 19 and 20, mount electrodes 16 and 17, and weight metal films 21 described later.

Figure 5:
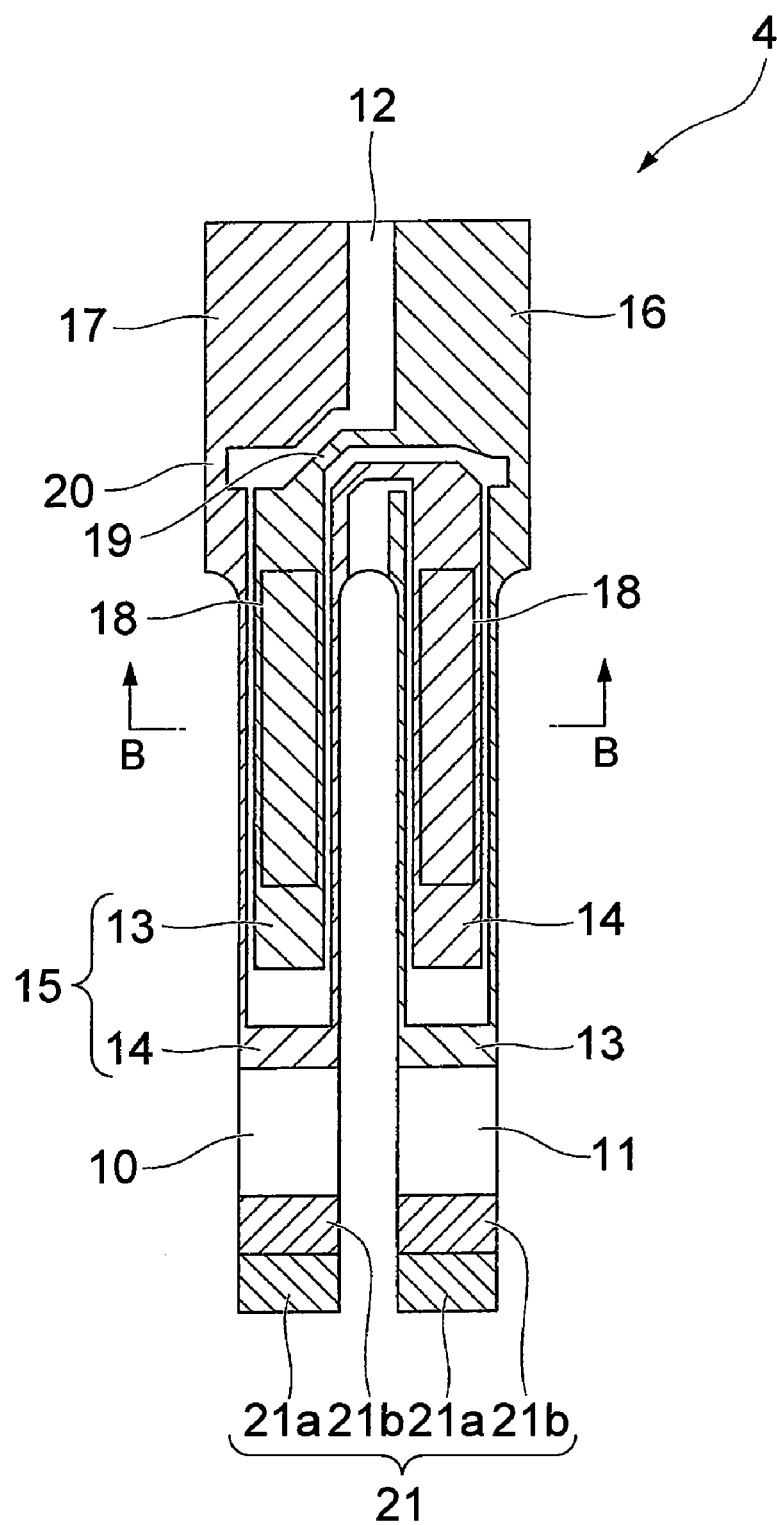
FIG. 5 is a top view of a piezoelectric oscillation piece constituting the piezoelectric transducer shown in FIG. 1.
Figure 6:
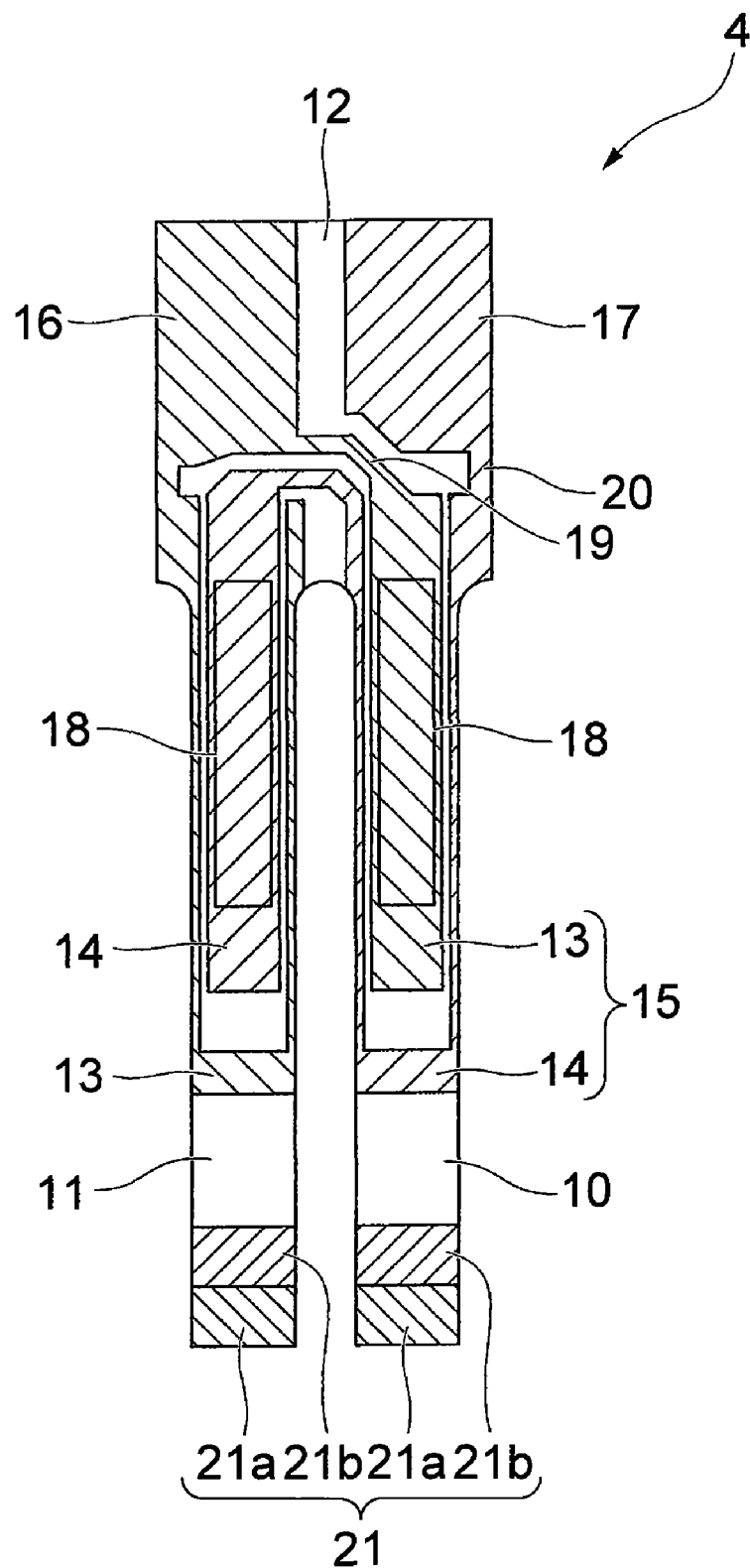
FIG. 6 is a bottom view of the piezoelectric oscillation piece shown in FIG. 5.
Figure 7:
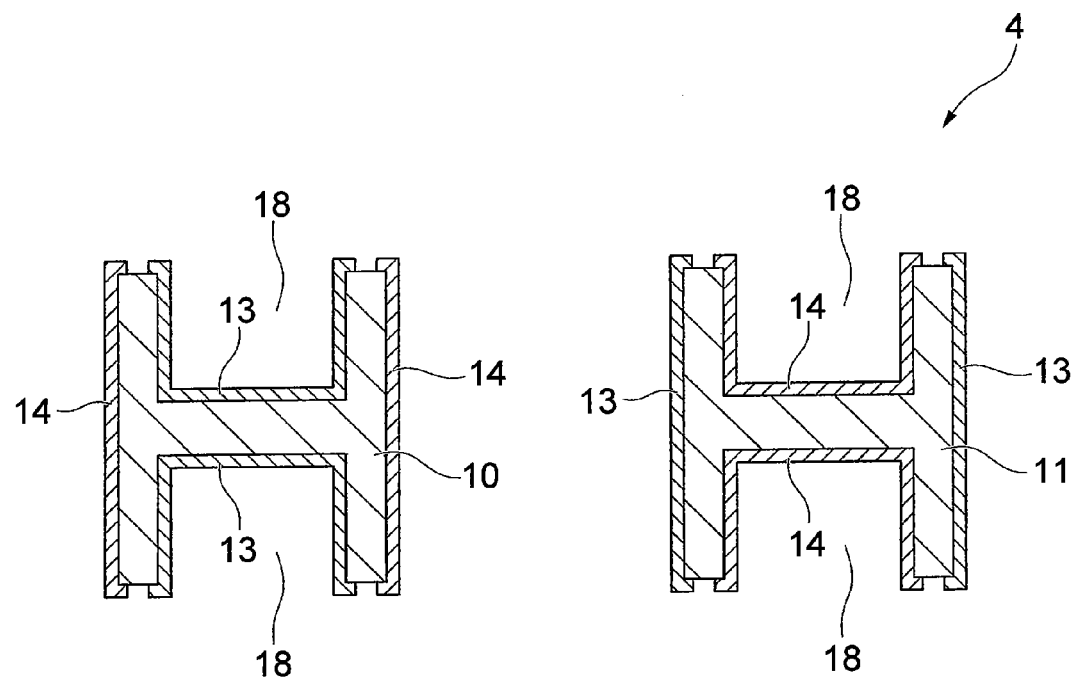
FIG. 7 is a cross-sectional view taken along a line with arrows B-B shown in FIG. 5.

As illustrated in FIGS. 5 through 7, the piezoelectric oscillation piece 4 is a tuning-fork-type oscillation piece made of piezoelectric material such as crystal, lithium tantalate, and lithium niobate, and oscillates when predetermined voltage is applied.

The piezoelectric oscillation piece 4 includes a pair of oscillation arms 10 and 11 disposed in parallel with each other, a base 12 for fixing the base ends of the pair of the oscillation arms 10 and 11 as one unit, oscillation electrodes 15 each having a first oscillation electrode 13 and a second oscillation electrode 14 provided on the outside surfaces of the pair of the oscillation arms 10 and 11 for oscillating the pair of the oscillation arms 10 and 11, and mount electrodes 16 and 17 electrically connected with the first oscillation electrode 13 and the second oscillation electrode 14.

Moreover, the piezoelectric oscillation piece 4 in this embodiment has grooves 18 formed on both main surfaces of the pair of the oscillation arms 10 and 11 in the longitudinal directions of the oscillation arms 10 and 11. The grooves 18 extend from the base ends of the oscillation arms 10 and 11 to approximately the centers of the oscillation arms 10 and 11.

The oscillation electrodes 15 each having the first oscillation electrode 13 and the second oscillation electrode 14 are electrodes for oscillating the pair of the oscillation arms 10 and 11 in the directions of moving close to and away from each other at a predetermined resonance frequency, and are patterned on the outside surfaces of the pair of the oscillation arms 10 and 11 while electrically separated from each other. More specifically, as illustrated in FIG. 7, the first oscillation electrode 13 is chiefly formed on the groove 18 of the one oscillation arm 10 and both side surfaces of the other oscillation arm 11, and the second oscillation electrode 14 is chiefly formed on both side surfaces of the one oscillation arm 10 and the groove 18 of the other oscillation arm 11.

As illustrated in FIGS. 5 and 6, the first oscillation electrode 13 and the second oscillation electrode 14 are electrically connected with the mount electrodes 16 and 17 via the extension electrodes 19 and 20, respectively, on both main surface of the base 12. Voltage is applied to the piezoelectric oscillation piece 4 via the mount electrodes 16 and 17.

The oscillation electrodes 15, the mount electrodes 16 and 17, and the extension electrodes 19 and 20 are formed by conductive film coating such as chrome (Cr), nickel (Ni), aluminum (Al), and titanium (Ti), for example.

The weight metal films 21 are coated on the tips of the pair of the oscillation arms 10 and 11 for controlling such that the oscillation arms 10 and 11 can oscillate within a predetermined frequency range (frequency control). Each of the weight metal films 21 is divided into a rough control film 21a for rough frequency control, and a fine control film 21b for fine frequency control. The frequency of the pair of the oscillation arms 10 and 11 is adjusted to a value lying within the nominal frequency range of the device by frequency control using the rough control film 21a and the fine control film 21b.

Figure 3:
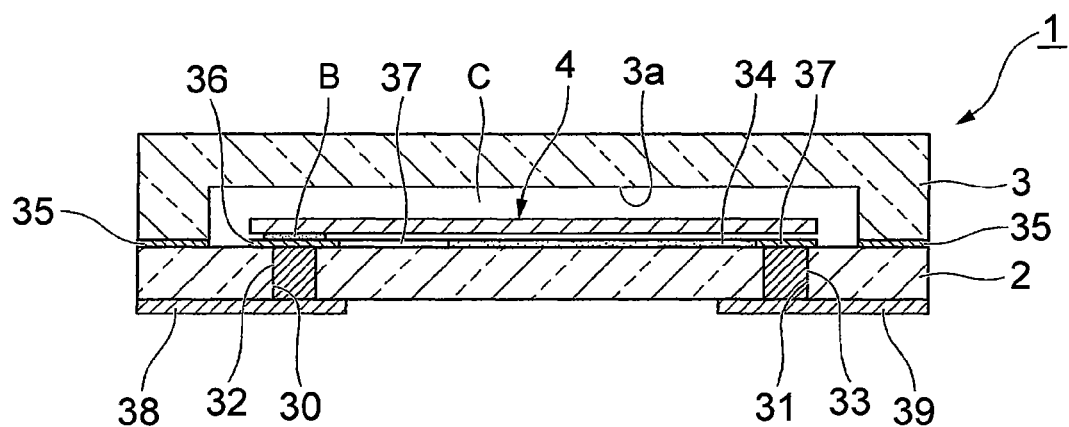
FIG. 3 is a cross-sectional view of the piezoelectric transducer taken along a line A-A in FIG. 2.
Figure 4:
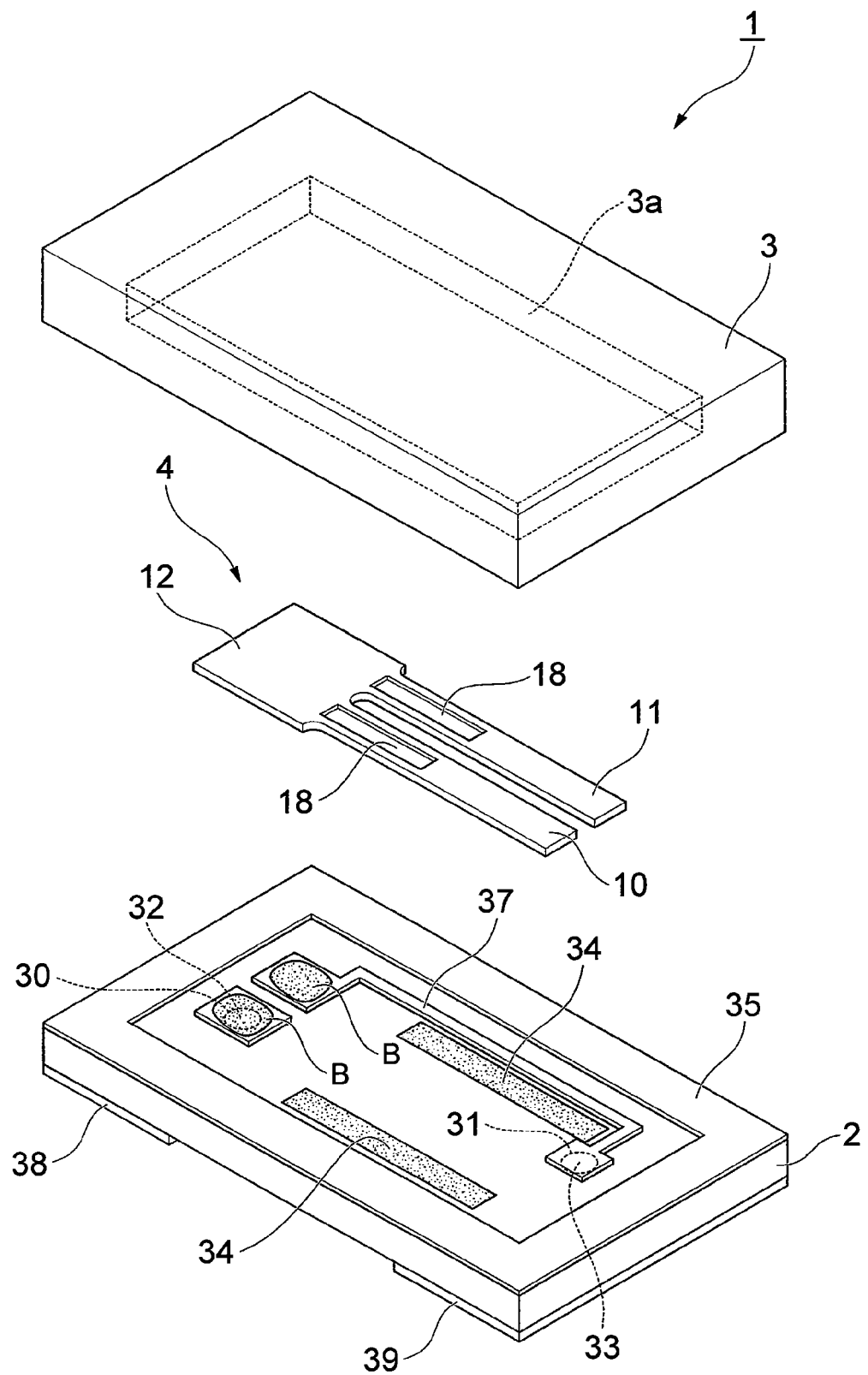
FIG. 4 is a perspective view illustrating the disassembled piezoelectric transducer shown in FIG. 1.

As illustrated in FIGS. 3 and 4, the piezoelectric oscillation piece 4 having this structure is joined to the upper surface of the base substrate 2 via bumps B made of gold or the like. More specifically, the pair of the mount electrodes 16 and 17 are connected with two bumps B provided on drawing electrodes 36 and 37 (described later) patterned on the upper surface of the base substrate 2 with contact between the mount electrodes 16 and 17 and the two bumps B, respectively. By this method, the piezoelectric oscillation piece 4 is supported with a clearance between the piezoelectric oscillation piece 4 and the upper surface of the base substrate 2, and the mount electrodes 16 and 17 are electrically connected respectively with the drawing electrodes 36 and 37.

The method of joining the piezoelectric oscillation piece 4 is not limited to bump connection. For example, the piezoelectric oscillation piece 4 may be joined by a conductive adhesive. However, in case of bump connection, the piezoelectric oscillation piece 4 can be positioned separately from the upper surface of the base substrate 2, and the minimum oscillation gap necessary for oscillation can be automatically secured. It is therefore preferable to employ bump connection.

The lid substrate 3 described above is a transparent insulation substrate made of glass material such as soda lime glass, and is plate-shaped as illustrated in FIGS. 1, 3 and 4. A rectangular recess 3a for accommodating the piezoelectric oscillation piece 4 is formed on the junction surface of the lid substrate 3 to which the base substrate 2 is joined.

The recess 3a is a cavity recess which becomes the cavity C for containing the piezoelectric oscillation piece 4 when both the substrates 2 and 3 are stacked on each other. The lid substrate 3 is joined with the base substrate 2 by anode junction with the recess 3a opposed to the base substrate 2. The method of connecting the base substrate 2 and the lid substrate 3 is not limited to anode junction. However, anode junction is preferable in view of firm connection between the substrates 2 and 3.

The base substrate 2 is a transparent insulation substrate made of glass material such as soda lime glass similarly to the lid substrate 3, and is a plate-shaped component having a size enough to be stacked on the lid substrate 3 as illustrated in FIGS. 1 through 4.

A pair of through holes 30 and 31 penetrating through the base substrate 2 are formed on the base substrate 2. The pair of the through holes 30 and 31 are formed in such positions as to lie within the cavity C. More specifically, the through holes 30 and 31 in this embodiment are disposed such that the one through hole 30 is positioned on the base 12 side of the mounted piezoelectric oscillation piece 4 and that the other through hole 31 is positioned on the tip side of the oscillation arms 10 and 11. A pair of through electrodes 32 and 33 are provided in the pair of the through holes 32 and 33 in such a manner as to fill up the through holes 32 and 33. As illustrated in FIG. 3, the through electrodes 32 and 33 completely close the through holes 30 and 31 to maintain the airtight condition inside the cavity C and provide continuity between external electrodes 38 and 39 described later and the drawing electrodes 36 and 37.

As illustrated in FIGS. 1 through 4, getter members (control film) 34 for increasing the degree of vacuum inside the cavity C when heated, a junction film 35 for anode junction, and the pair of the drawing electrodes 36 and 37 are patterned on the upper side of the base substrate 2 (junction surface side to which the lid substrate 3 is connected). The junction film 35 and the pair of the drawing electrodes 36 and 37 are formed by conductive material (such as aluminum).

Figure 2:
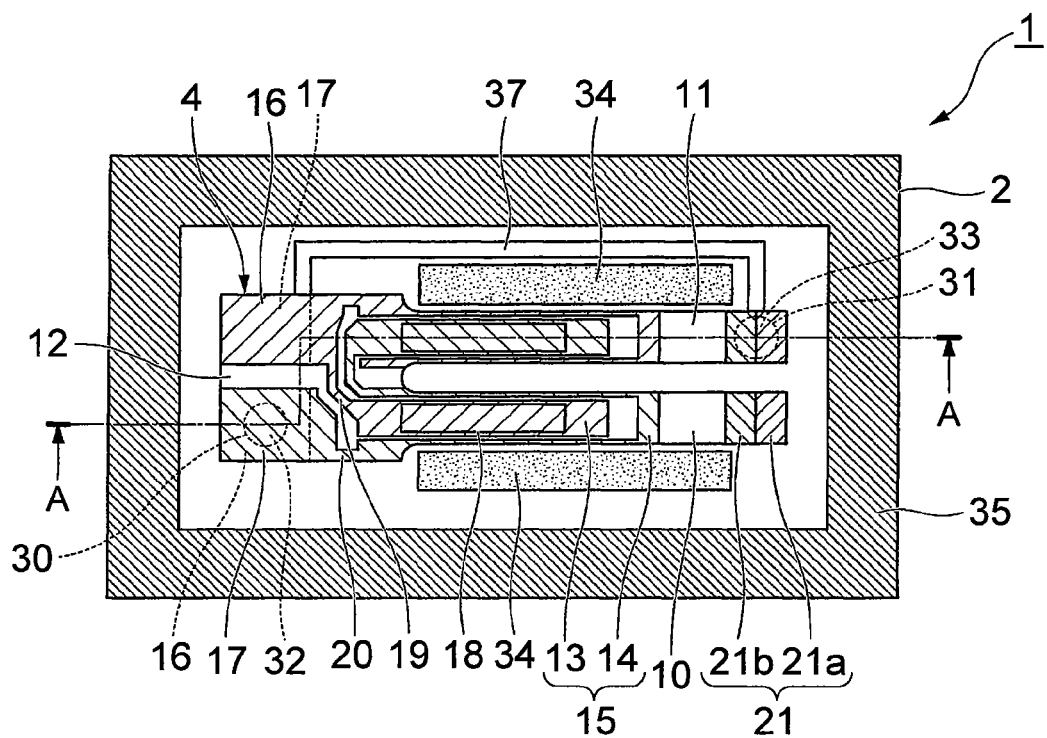
FIG. 2 illustrates the internal structure of the piezoelectric transducer shown in FIG. 1, showing the piezoelectric transducer from which a lid substrate is removed as viewed from above.

The getter members 34 are made of aluminum or the like and extend from the base ends to the tips of the oscillation arms 10 and 11 adjacent to the pair of the oscillation arms 10 and 11 in the longitudinal direction of the oscillation arms 10 and 11 as viewed in the plan view. More specifically, the getter members 34 are a pair of components provided on the outside surface sides of the pair of the oscillation arms 10 and 11 as illustrated in FIGS. 2 and 4.

The junction film 35 is formed along the periphery of the base substrate 2 in such a manner as to surround the circumference of the recess 3a provided on the lid substrate 3.

The pair of the drawing electrodes 36 and 37 are patterned in such a condition as to electrically connect the through electrode 32 as one of the through electrodes 32 and 33 with the mount electrode 16 of the piezoelectric oscillation piece 4, and electrically connect the other through electrode 33 with the other mount electrode 17 of the piezoelectric oscillation piece 4.

More specifically, the one drawing electrode 36 is provided just above the one through electrode 32 in such a position as to be located just below the base 12 of the piezoelectric oscillation piece 4. The other drawing electrode 37 is drawn from a position adjacent to the one drawing electrode 36 along the oscillation arms 10 and 11 toward the tips of the oscillation arms 10 and 11 to reach a position just above the other through electrode 33.

The bump B is formed on each of the pair of drawing electrodes 36 and 37, and the piezoelectric oscillation piece 4 is mounted by using the bumps B. In this structure, the one mount electrode 16 of the piezoelectric oscillation piece 4 is connected with the one through electrode 32 via the one drawing electrode 36 with continuity between the mount electrode 16 and the through electrode 32, and the other mount electrode 17 is connected with the other through electrode 33 via the other drawing electrode 37 with continuity between the mount electrode 17 and the through electrode 33.

As illustrated in FIGS. 1, 3 and 4, the external electrodes 38 and 39 electrically connected respectively with the pair of the through electrodes 32 and 33 are provided on the lower surface of the base substrate 2. That is, the one external electrode 38 is electrically connected with the first oscillation electrode 13 of the piezoelectric oscillation piece 4 via the one through electrode 32 and the one drawing electrode 36. On the other hand, the other external electrode 39 is electrically connected with the second oscillation electrode 14 of the piezoelectric oscillation piece 4 via the other through electrode 33 and the other drawing electrode 37.

For operating the piezoelectric transducer 1 having this structure, predetermined drive voltage is applied to the external electrodes 38 and 39 provided on the base substrate 2. When the drive voltage is applied, current flows in the oscillation electrodes 15 having the first oscillation electrode 13 and the second oscillation electrode 14 provided on the piezoelectric oscillation piece 4. As a result, the pair of the oscillation arms 10 and 11 can oscillate in such directions as to move close to and away from each other at a predetermined frequency. Accordingly, the oscillation of the pair of the oscillation arms 10 and 11 can be used for a time source, a control signal timing source, a reference signal source, or for other purposes.

A method of manufacturing the plural piezoelectric transducers 1 described above using a base substrate wafer (base substrate) 40 and a lid substrate wafer (lid substrate) 50 at a time is now explained with reference to a flowchart shown in FIG. 8. According to this embodiment, the plural piezoelectric transducers 1 are manufactured by one process using wafer-shaped substrates. However, the number of the piezoelectric transducer 1 produced at a time may be only one manufactured by processing substrates having dimensions matched with the external shapes of the base substrate 2 and the lid substrate 3 beforehand, for example.

Initially, the piezoelectric oscillation piece 4 shown in FIGS. 5 through 7 is produced by performing a piezoelectric oscillation piece producing step (S10). More specifically, crystal lambert ore is sliced at a predetermined angle to produce a wafer having a certain thickness. The wafer is wrapped and roughly processed, and the processed and affected layer is removed by etching. Then, the wafer is processed by mirror-grinding such as polishing to produce a wafer having a predetermined thickness. After appropriate processing such as cleaning, the wafer is patterned in the outside shape of the piezoelectric oscillation piece 4 by photolithography, and the metal film is formed and patterned to produce the oscillation electrodes 15, the extension electrodes 19 and 20, the mount electrodes 16 and 17, and the weight metal films 21. The plural piezoelectric oscillation pieces 4 can be manufactured by this method.

After manufacture of the piezoelectric oscillation piece 4, the resonance frequency is roughly controlled. This control is performed by applying laser beam to the rough control films 21a of the weight metal films 21 such that a part of the rough control films 21a can be evaporated for weight change. The fine control for controlling the resonance frequency with higher accuracy is performed after mounting. This control will be described later.

Figure 9:
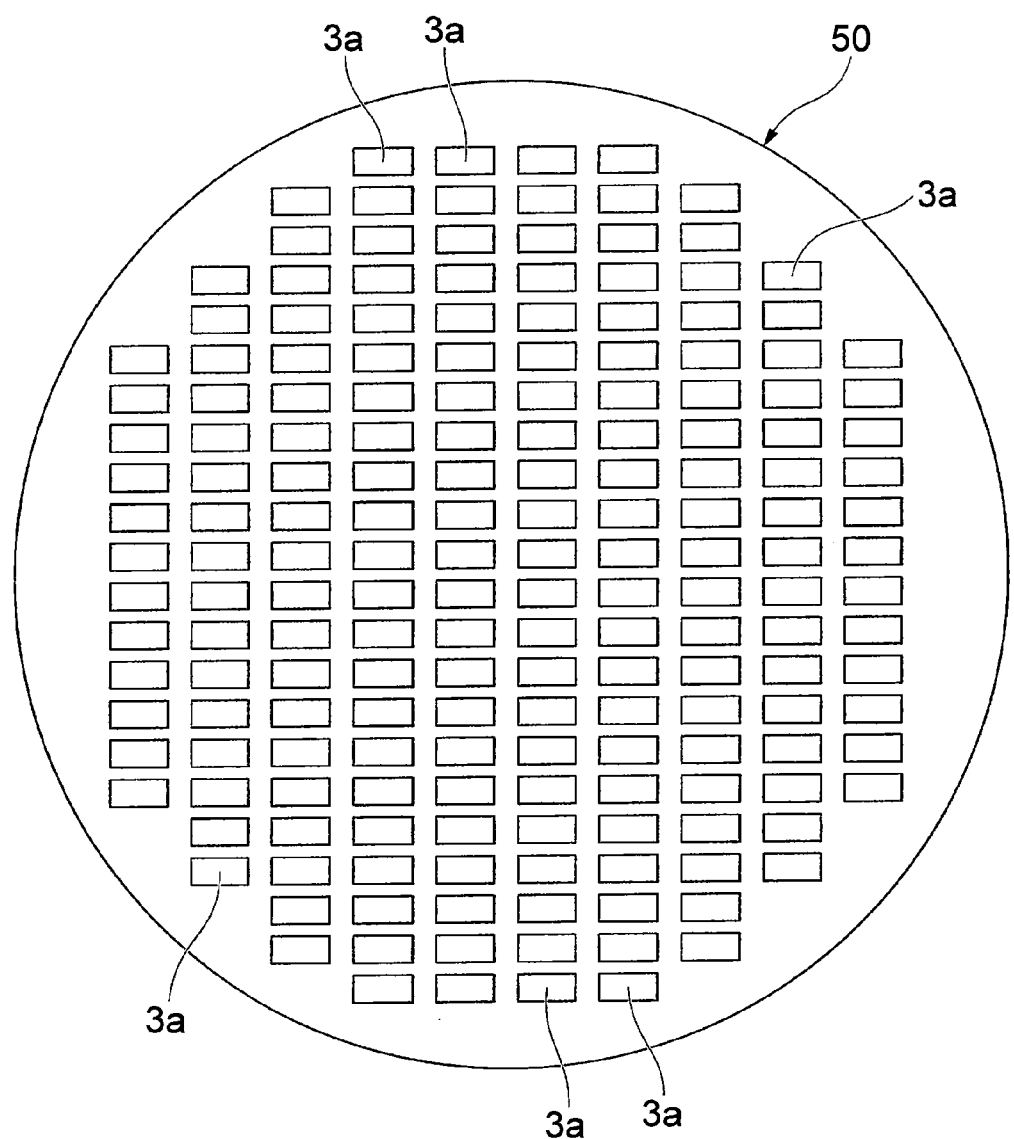
FIG. 9 illustrates a step in the process for manufacturing the piezoelectric transducer according to the flowchart shown in FIG. 8, showing a condition in which a plurality of recesses and a junction film are formed on a lid substrate wafer which becomes the lid substrate.

Then, a first wafer producing step for producing the lid substrate wafer 50 which finally becomes the lid substrate 3 until the stage immediately before the anode junction is performed (S20). Initially, soda lime glass is ground to have a predetermined thickness and cleaned. Then, the disk-shaped lid substrate wafer 50 from which the processed and affected layer on the outermost surface is removed by etching or other methods is produced (S21). Subsequently, as illustrated in FIG. 9, a recess forming step for forming the plural cavity recesses 3a by etching or other methods in the line directions on the junction surface of the lid substrate wafer 50 is performed (S22). In this stage, the first wafer producing step ends.

Then, a second wafer producing step for producing the base substrate wafer 40 which finally becomes the base substrate 2 until the stage immediately before the anode junction is performed simultaneously with or before or after the above step (S30). Initially, soda lime glass is ground to have a predetermined thickness and cleaned. Then, the disk-shaped base substrate wafer 40 from which the processed and affected layer on the outermost surface is removed by etching or other methods is produced (S31).

Then, a through electrode forming step for forming plural pairs of the through electrodes 32 and 33 on the base substrate wafer 40 is performed (S32). More specifically, plural pairs of the through holes 30 and 31 are formed by sand blasting, pressing or other methods. Then, a pair of the through electrodes 32 and 33 are formed in each pair of the plural pairs of the through holes 30 and 31. Each pair of the through holes 30 and 31 are sealed by the corresponding pair of the through electrodes 32 and 33, and electric continuity is secured between the upper surface and the lower surface of the base substrate wafer 40.

Then, aluminum or the like is patterned on the upper surface of the base substrate wafer 40 to perform a control film forming step for forming the getter members 34 on the base substrate wafer 40 (S33). In this case, the getter members 34 provided adjacent to the pair of the oscillation arms 10 and 11 extend in the longitudinal direction of the oscillation arms 10 and 11 from the base ends toward the tips of the oscillation arms 10 and 11 as viewed in the plan view.

Figure 10:
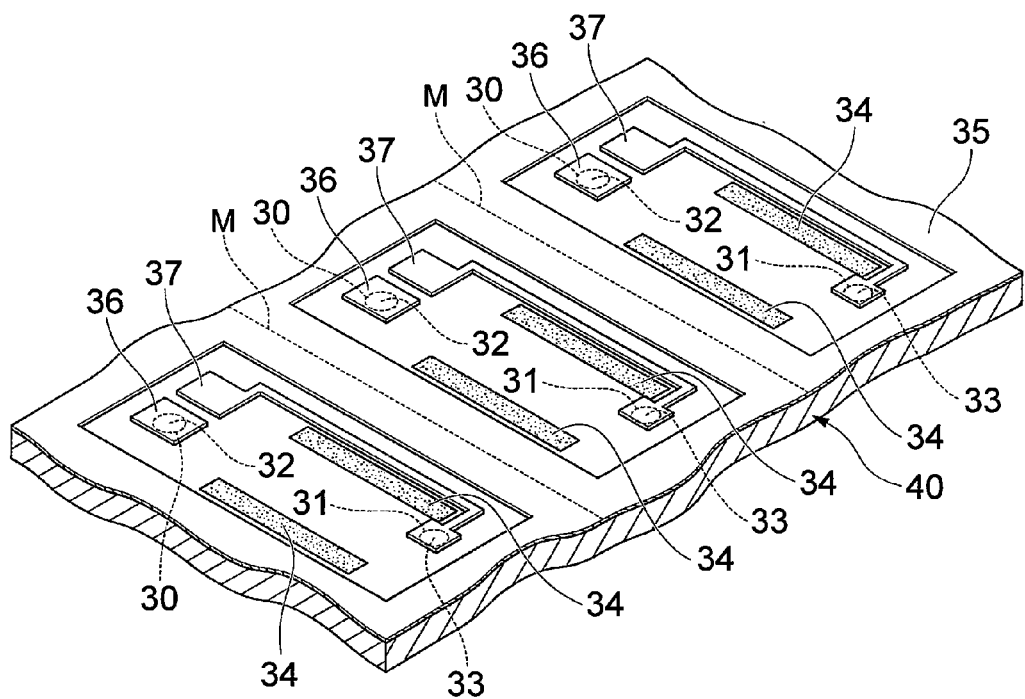
FIG. 10 illustrates a step in the process for manufacturing the piezoelectric transducer according to the flowchart shown in FIG. 8, showing a condition in which getter members, through electrodes, drawing electrodes, and the junction film are formed on a base substrate wafer which becomes a base substrate.
Figure 11:
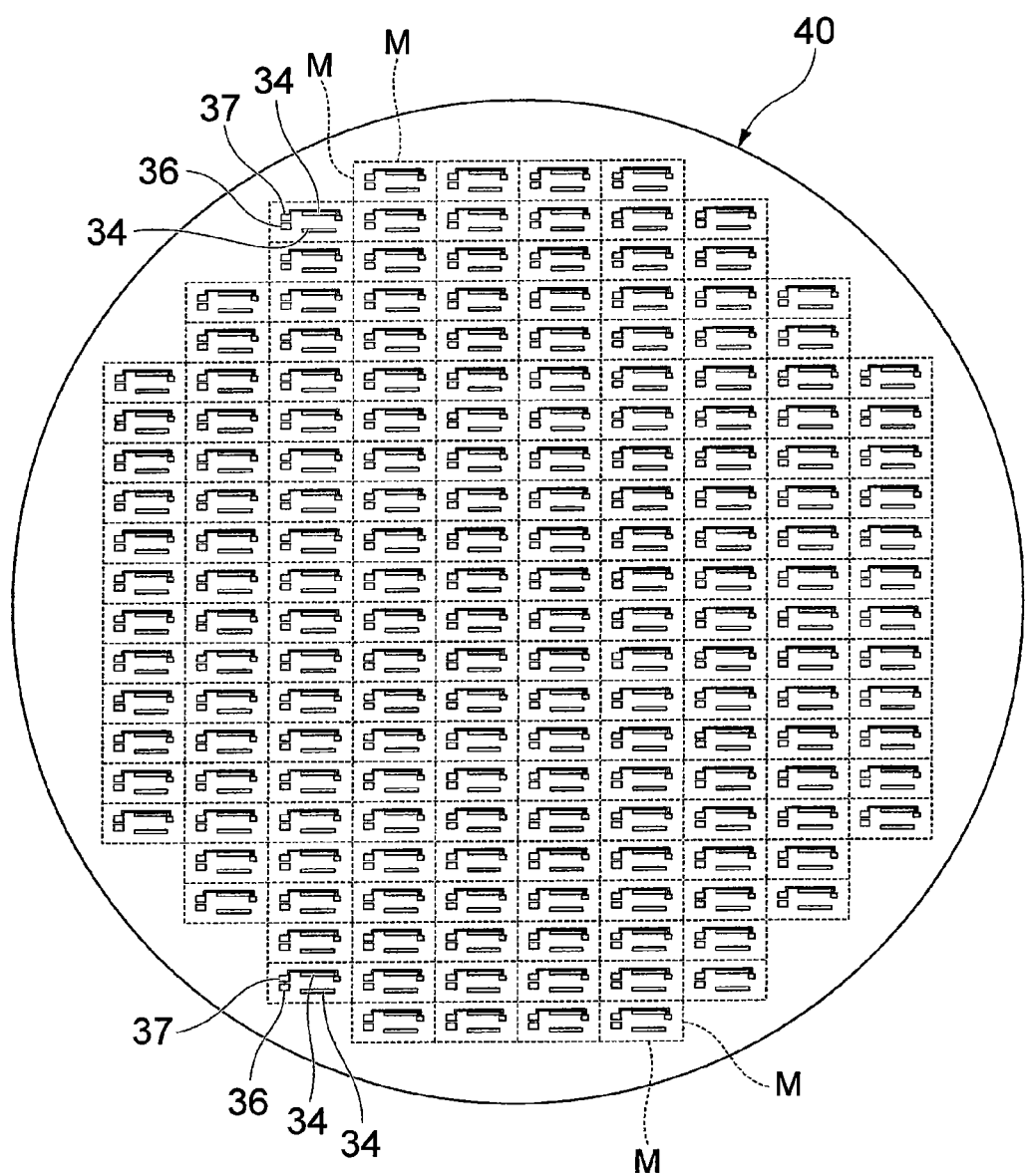
FIG. 11 illustrates the whole base substrate wafer in the condition shown in FIG. 10.

Then, as illustrated in FIGS. 10 and 11, the conductive material is patterned on the upper surface of the base substrate wafer 40 to perform a junction film forming step for forming the junction film 35 (S34) and a drawing electrode forming step for forming plural pairs of the drawing electrode 36 and 37 each pair of which are electrically connected with the corresponding pair of the through electrodes 32 and 33 (S35). Dotted lines M shown in FIGS. 10 and 11 are cut lines along which a cutting step is performed later.

The second wafer producing step ends after completing these processes.

Figure 8:
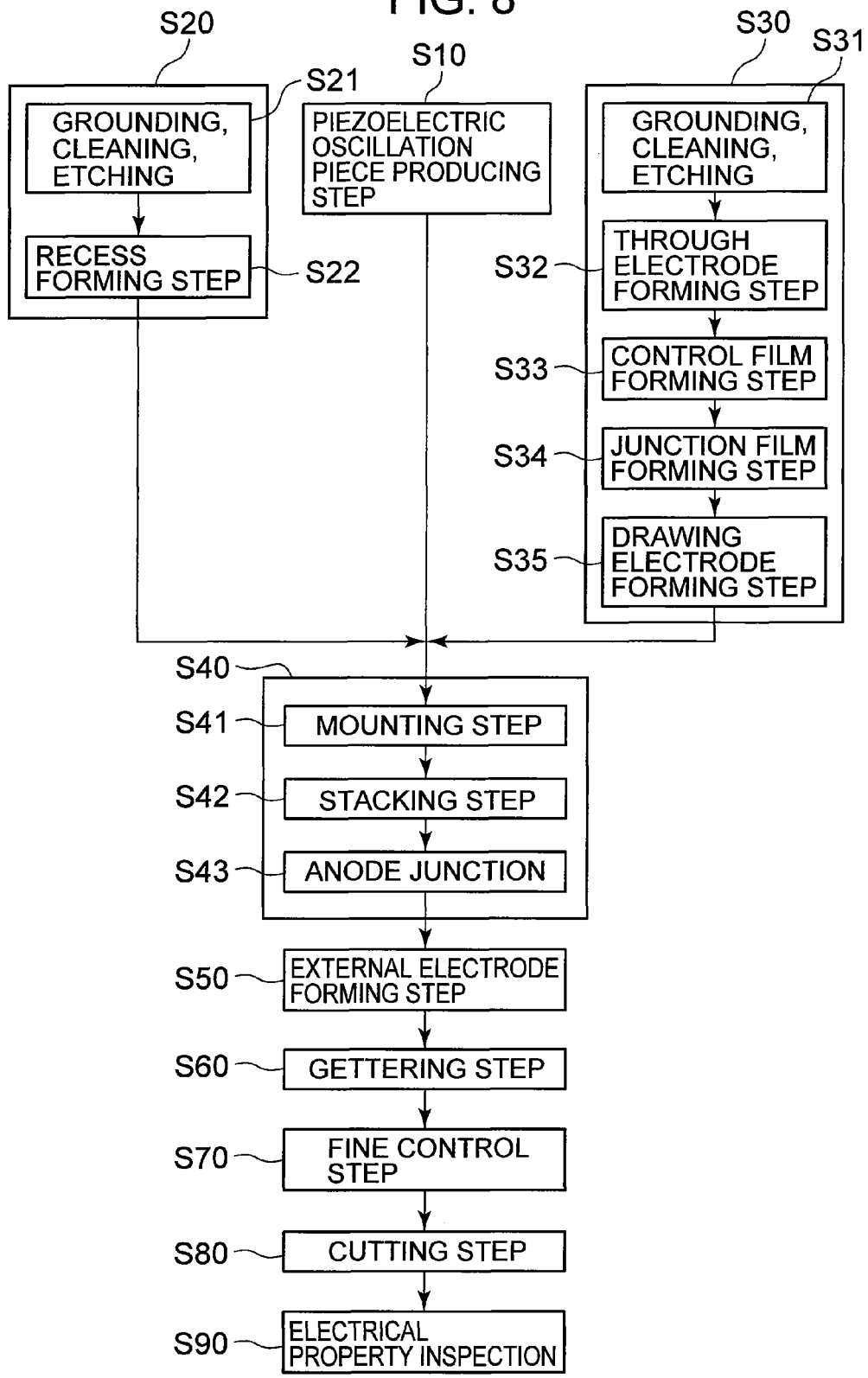
FIG. 8 is a flowchart showing flow of a process for manufacturing the piezoelectric transducer shown in FIG. 1.

In FIG. 8, the control film forming step (S33), the junction film forming step (S34), and the drawing electrode forming step (S35) are performed in this order. However, the order of the steps is not limited to this order, and all the steps may be executed at the same time. Similar advantages can be provided regardless of the order of the steps. Thus, the order of the steps may be changed as necessary.

Then, a joining step for joining the base substrate wafer 40 and the lid substrate wafer 50 is performed (S40). The details of the joining step are now discussed. Initially, a mounting step for connecting the produced plural piezoelectric oscillation pieces 4 to the upper surface of the base substrate wafer 40 via the drawing electrodes 36 and 37 is performed (S41). First, the bump B made of gold or the like is formed on each of the pair of the drawing electrodes 36 and 37. Then, the base 12 of the piezoelectric oscillation piece 4 is placed on the bumps B, and the piezoelectric oscillation piece 4 is pressed against the bumps B while heating the bumps B at a predetermined temperature. As a result, the piezoelectric oscillation piece 4 is mechanically supported by the bumps B, and the mount electrodes 16 and 17 are electrically connected with the drawing electrodes 36 and 37. In this step, the pair of the oscillation electrodes 15 on the piezoelectric oscillation piece 4 are connected respectively with the pair of the through electrodes 32 and 33 with continuity.

Particularly, the piezoelectric oscillation piece 4 connected by bumps is supported with a clearance between the piezoelectric oscillation piece 4 and the upper surface of the base substrate wafer 40.

After mounting the piezoelectric oscillation piece 4, a stacking step for stacking the lid substrate wafer 50 on the base substrate wafer 40 is performed (S42). More specifically, both the wafers 40 and 50 are aligned at proper positions using a not-shown reference mark or the like as index. As a result, the mounted piezoelectric oscillation piece 4 is accommodated in the cavity C surrounded by the recess 3a formed on the base substrate wafer 40 and both the wafers 40 and 50.

Figure 12:
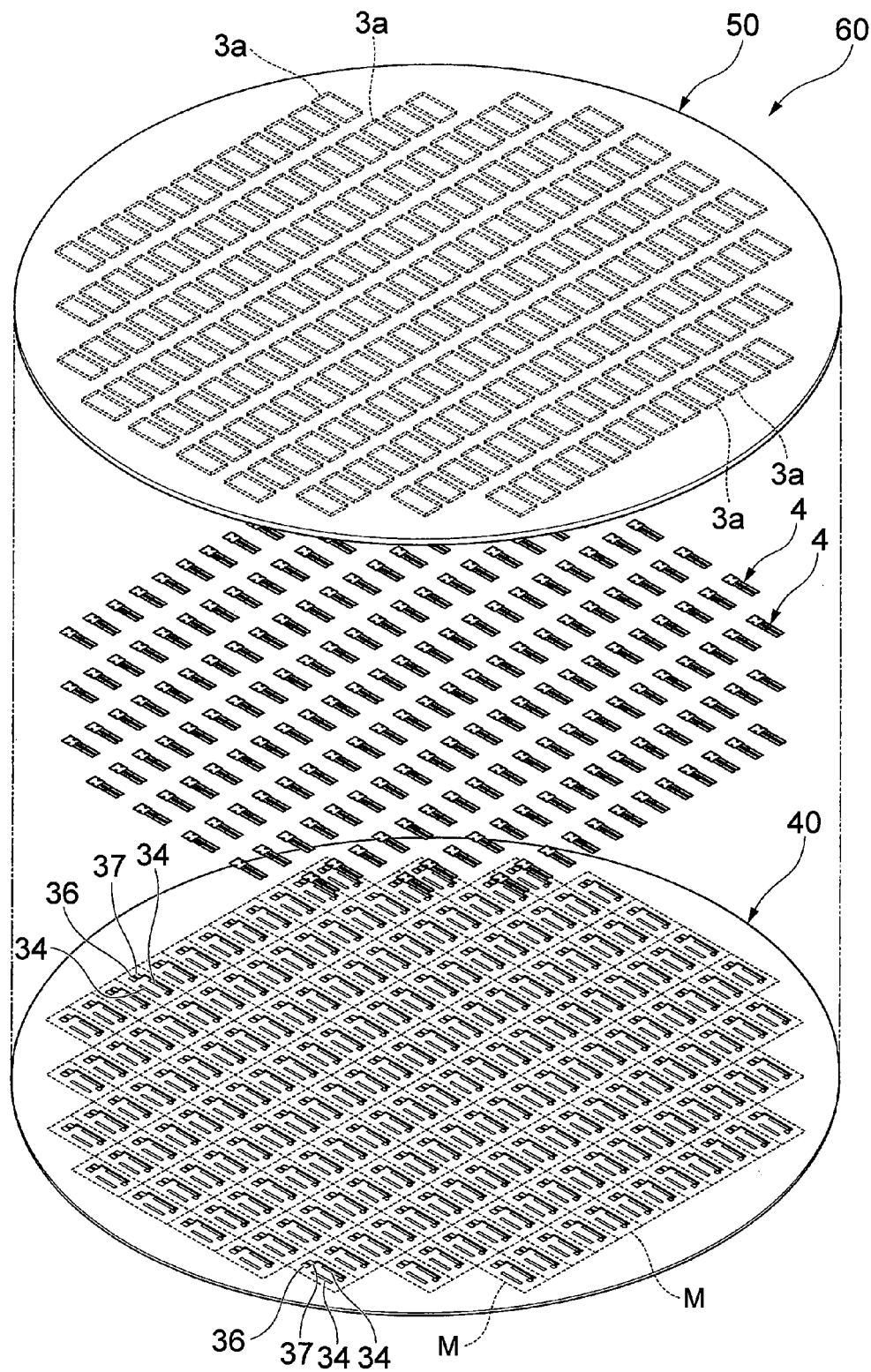
FIG. 12 illustrates a step in the process for manufacturing the piezoelectric transducer according to the flowchart shown in FIG. 8, showing a perspective view of a disassembled wafer body having the base substrate wafer and the lid substrate wafer joined by anode junction with the piezoelectric oscillation pieces accommodated in cavities.

After the stacking step, the stacked two wafers 40 and 50 are inserted into a not-shown anode junction device to carry out anode junction by applying predetermined voltage in a predetermined temperature atmosphere (S43). More specifically, predetermined voltage is applied between the junction film 35 and the lid substrate wafer 50. As a result, electrochemical reaction is produced on the interface between the junction film 35 and the lid substrate wafer 50, and the two components are brought into tight contact with each other for anode junction. By this method, the piezoelectric oscillation piece 4 can be sealed into the cavity C, and a wafer body 60 having the base substrate wafer 40 and the lid substrate wafer 50 joined to each other shown in FIG. 12 can be produced. FIG. 12 shows the disassembled wafer body 60 for easy understanding of the figure, and does not show the junction film 35 on the base substrate wafer 40. The dotted lines M shown in FIG. 12 shows cut lines along which the cutting step is performed later. The joining step ends after completion of the anode junction.

After the end of the anode junction explained above, conductive material is patterned on the lower surface of the base substrate wafer 40 to perform an external electrode forming step for forming plural pairs of the external electrodes 38 and 39 each pair of which are electrically connected with the corresponding pair of the through electrodes 32 and 33 (S50). By this step, each of the piezoelectric oscillation pieces 4 sealed in the cavity C can be operated by using the external electrodes 38 and 39.

Then, a gettering step for locally heating and evaporating the getter members 34 while measuring the series resonance resistance is performed after oscillation of the piezoelectric oscillation piece 4 sealed in the cavity C for adjusting the degree of vacuum inside the cavity C equal to or higher than a certain level (S60).

More specifically, voltage is applied to the pair of the external electrodes 38 and 39 formed on the lower surface of the base substrate wafer 40 to oscillate the piezoelectric oscillation piece 4. Then, laser beam is applied from outside through the lid substrate wafer 50 while measuring the series resonance resistance to heat and evaporate the getter members 34. By this method, appropriate series resonance resistance can be secured.

In the gettering step, the frequency is controlled to a value lying within an approximate range around a target value by using the getter members 34 while measuring the frequency simultaneously with the control over the degree of vacuum inside the cavity C.

The frequency control method during the gettering step is now explained. Initially, the getter members 34 are formed adjacent to the pair of the oscillation arms 10 and 11 as viewed in the plan view. Thus, when the getter members 34 are heated for evaporation, the getter members 34 are locally deposited on the side surfaces of the oscillation arms 10 and 11 located in the vicinity of the heating positions. In this case, the frequency increases when the deposition positions of the getter members 34 are located on the base end side of the oscillation arms 10 and 11, and decreases when the deposition positions of the getter members 34 are located on the tip side. Thus, the frequency can be increased or decreased by changing the heating positions of the getter members 34. Therefore, the oscillation characteristics of the oscillation arms 10 and 11 can be varied by determining the heating positions of the getter members 34 according to the difference between the approximate range and the frequency actually measured and by locally depositing the evaporated getter members 34 on the side surfaces of the oscillation arms 10 and 11. Accordingly, the frequency of the pair of the oscillation arms 10 and 11 can be adjusted to a value lying within the approximate range around the target value simultaneously with gettering.

Figure 13:
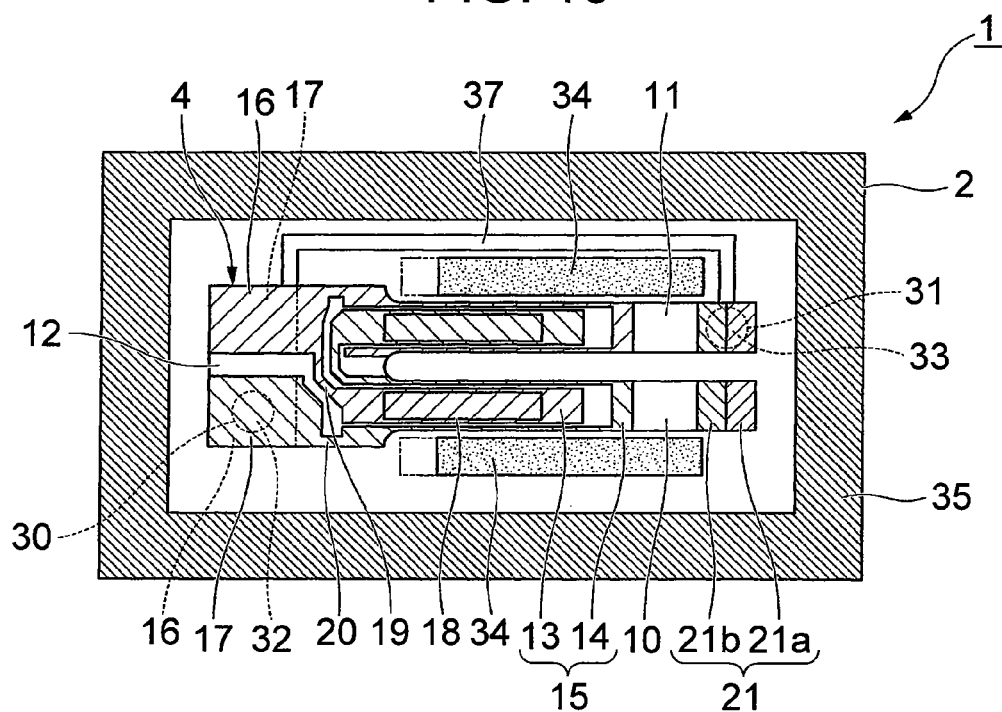
FIG. 13 illustrates a step in the process for manufacturing the piezoelectric transducer according to the flowchart shown in FIG. 8, showing a condition in which the getter members on the base end side of oscillation arms are heated and evaporated.

When the frequency is lower than the approximate range, for example, the getter members 34 on the base end side of the pair of the oscillation arms 10 and 11 (for example, the range indicated by two-dot chain lines in FIG. 13) are heated as illustrated in FIG. 13. By this method, the frequency increases to a value close to the approximate range.

Accordingly, appropriate series resonance resistance can be secured by the gettering step, and also the frequency can be brought into the approximate range in advance. The degree of vacuum inside the cavity C is not affected by the heating positions of the getter members 34.

Then, a fine control step for heating the fine control films 21b of the weight metal films 21 using leaser or the like while continuously measuring the frequency is performed for fine control of the frequency within the approximate range such that the frequency comes close to the target value (S70). By this step, the frequency of the piezoelectric oscillation piece 4 can be finely adjusted to a value lying within a predetermined range of the nominal frequency.

After the frequency fine adjustment, a cutting step for cutting the joined wafer body 60 along the cutting lines M shown in FIG. 12 into small pieces (S80) is performed. As a result, the plural two-layer structure surface mount device piezoelectric transducers 1 each of which has the piezoelectric oscillation piece 4 sealed into the cavity C formed between the base substrate 2 and the lid substrate 3 connected by anode junction can be manufactured at a time.

It is possible to perform the gettering step (S60) and the fine control step (S70) after the cutting step (S80) producing the respective small pieces of the piezoelectric transducers 1. However, when fine control is performed for the wafer body 60 by conducting the gettering step (S60) and the fine control step (S70) prior to the cutting step (S80) as explained above, the plural piezoelectric transducers 1 can be finely controlled with higher efficiency. This method is therefore more preferable in view of higher throughput.

Then, internal electrical property inspection is performed (S90). More specifically, the resonance frequency, the resonance resistance, the drive level property (oscillation power dependences of resonance frequency and resonance resistance) and the like of the piezoelectric oscillation piece 4 is measured and checked. Then, the external appearance of the piezoelectric transducer 1 is finally inspected for the final check of the dimensions, quality and the like. By this step, manufacture of the piezoelectric transducer 1 ends.

According to this method, a plurality of surface mount device piezoelectric transducers each of which has the piezoelectric oscillation piece sealed into the cavity formed between the base substrate and the lid substrate joined to each other can be manufactured at a time.

Particularly, in the related art which uses only the fine control films 21b for frequency control, the fine control films 21b having variations in the film thickness need to be repeatedly and carefully removed. According to the invention, however, the frequency has been already adjusted to a value lying within the approximate range of the target value before the fine control step, and thus the fine control films 21b are removed only slightly. In this case, fine control can be performed with high accuracy in a short time without serious effect from the variations of the film thickness. Accordingly, the product quality improves. Moreover, since the fine control films 21b are not required to be heated many times unlike the related art, accumulation of heating load can be reduced. Thus, the quality of the piezoelectric transducer 1 also improves in this aspect.

Furthermore, since the steps of gettering and fine control carried out at different times in the related art can be simultaneously performed, the manufacture process can be simplified. Thus, manufacture efficiency can be increased.

[Second Embodiment]

Figure 14:
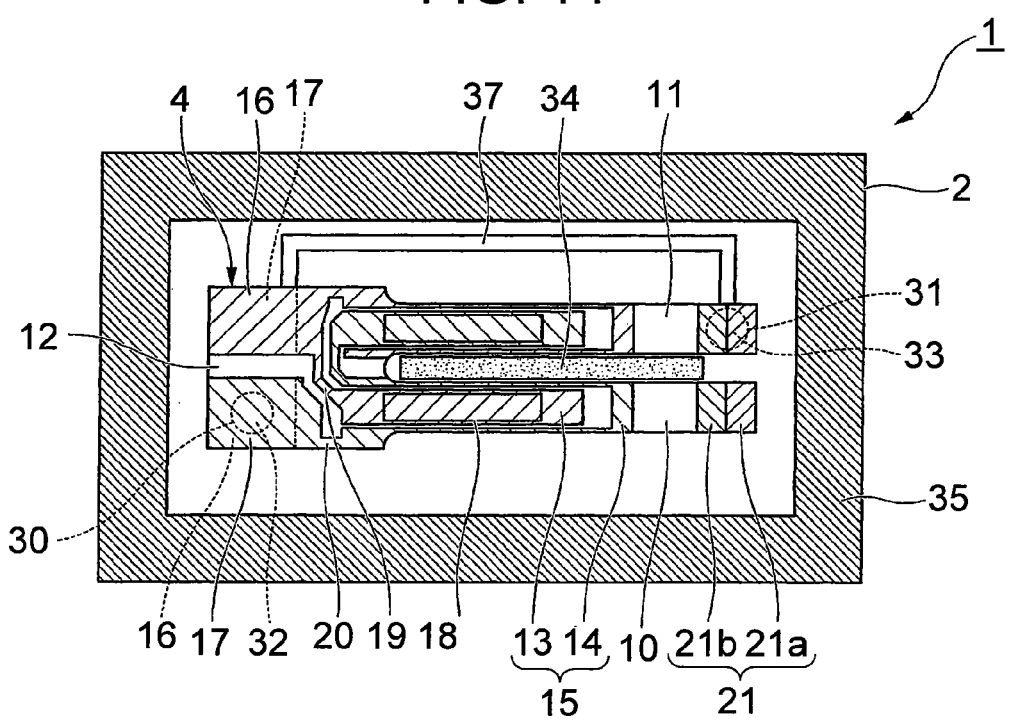
FIG. 14 is an internal structure of a piezoelectric transducer according to a second embodiment of the invention, showing the piezoelectric transducer from which a lid substrate is removed as viewed from above.

Next, a second embodiment of the invention is hereinafter described with reference to FIG. 14. In the second embodiment, similar reference numbers are given to components similar to those in the first embodiment, and the same explanation is not repeated.

The second embodiment is different from the first embodiment in the getter members 34 formed in the control film forming step. While a pair of the getter members 34 are provided on the outside side surfaces of a pair of the oscillation arms 10 and 11 in the first embodiment, the getter member 34 is disposed between the pair of the oscillation arms 10 and 11 as viewed in the plan view in the second embodiment. That is, the getter member 34 is positioned in the vicinity of both the pair of the oscillation arms 10 and 11.

According to this embodiment, the advantages similar to those in the first embodiment can be offered, and the getter member 34 can be deposited on both side surfaces of the pair of the oscillation arms 10 and 11 by heating only one position of the getter member 34. Thus, the process for forming a pair of the getter members 34 adjacent to each of the oscillation arms 10 and 11 and heating the pair of the getter members 34 is not required. Accordingly, the manufacture process can be further simplified.

[Third Embodiment]

Figure 19:
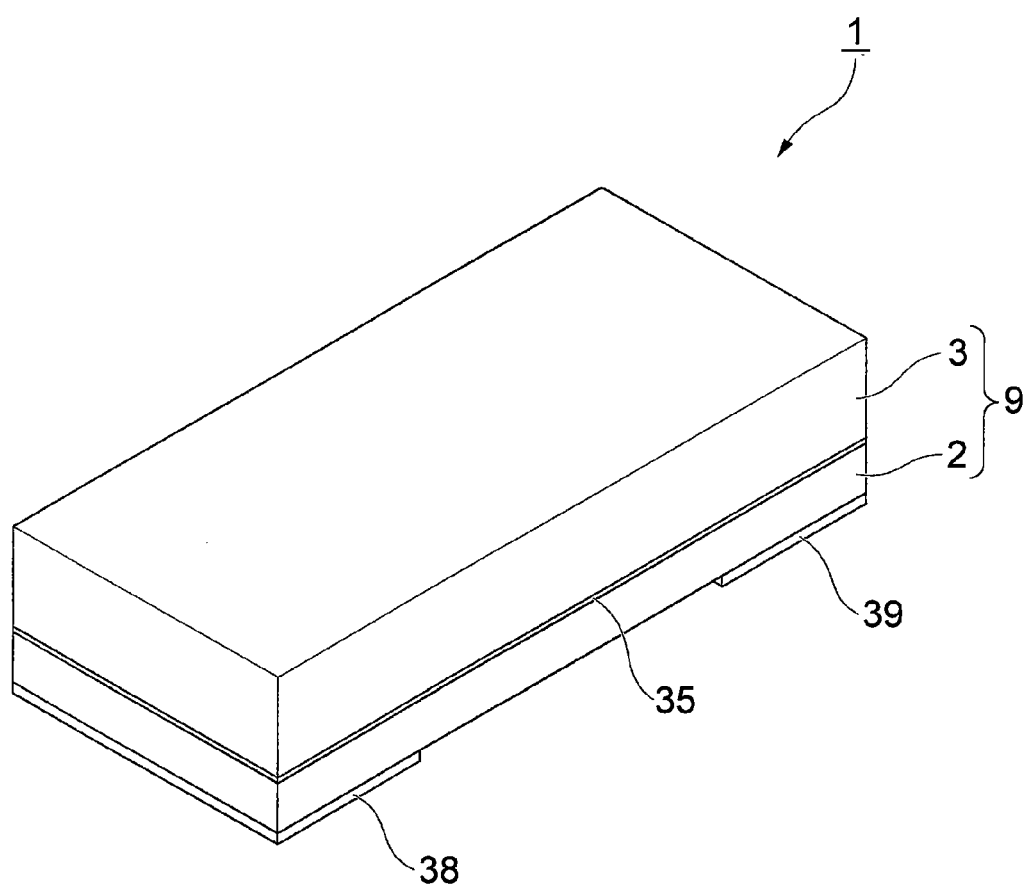
FIG. 19 is a perspective view illustrating the external appearance of a piezoelectric transducer according to an embodiment.
Figure 20:
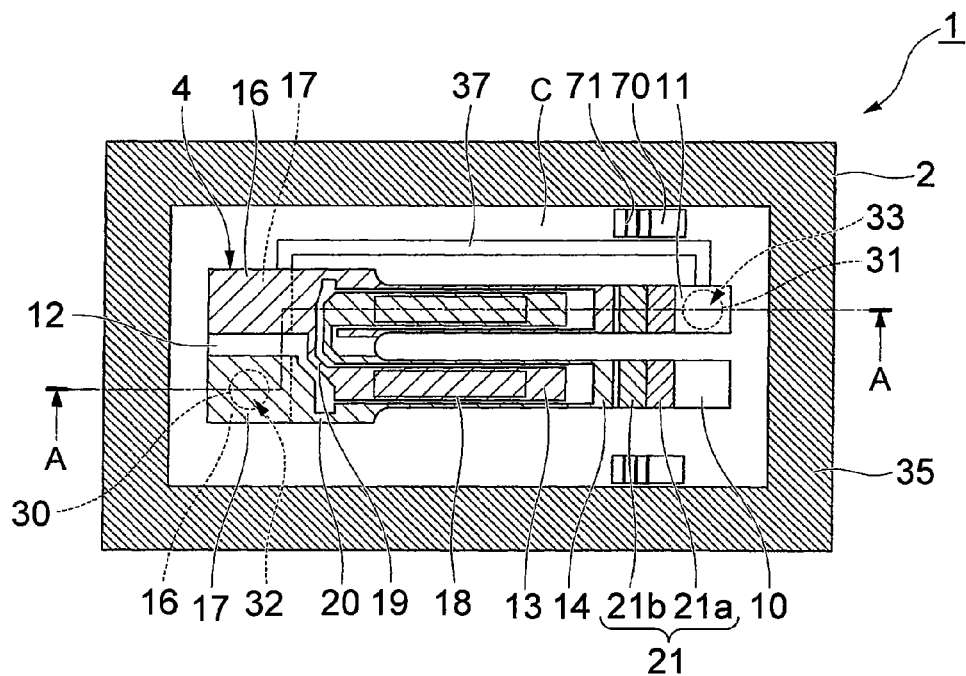
FIG. 20 is the internal structure of the piezoelectric transducer shown in FIG. 19, showing the piezoelectric transducer from which a lid substrate is removed as viewed from above.
Figure 21:
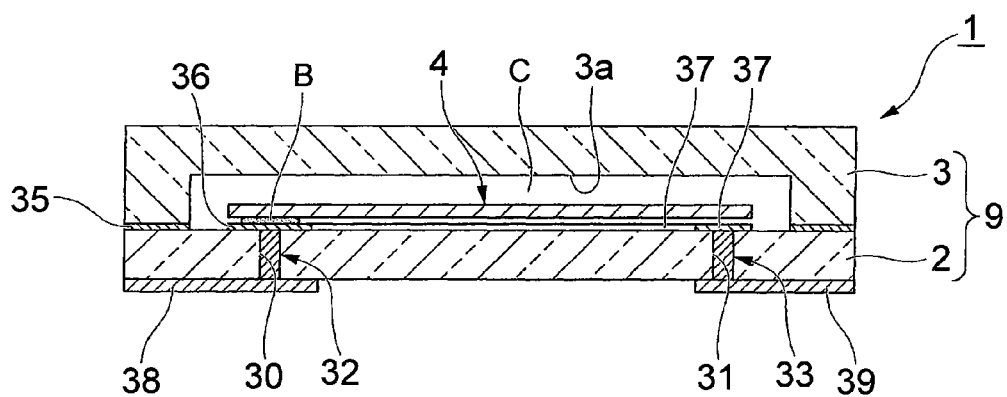
FIG. 21 is a cross-sectional view of the piezoelectric transducer taken along a line A-A in FIG. 20.
Figure 22:
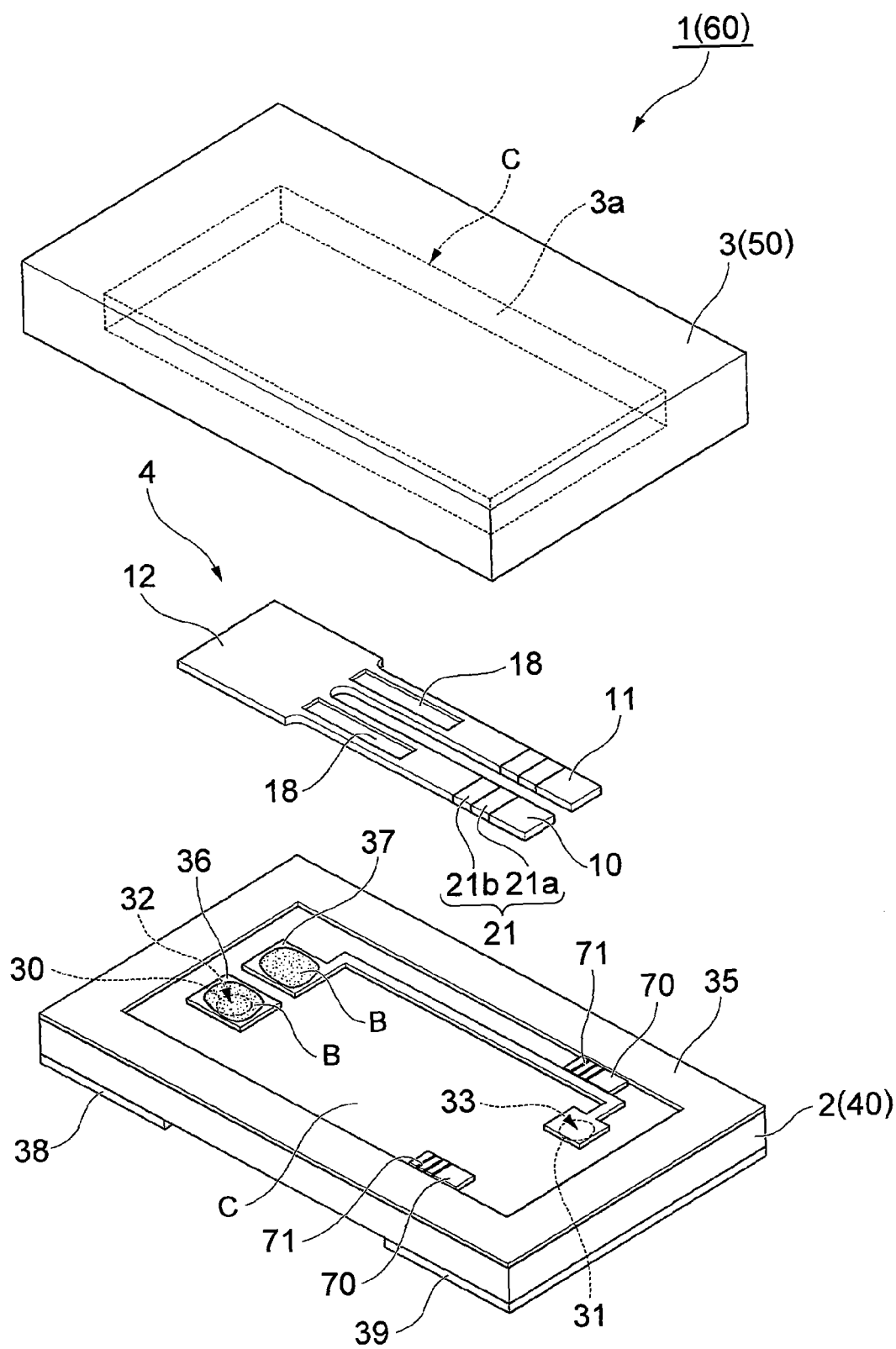
FIG. 22 is a perspective view illustrating the disassembled piezoelectric transducer shown in FIG. 19.

FIG. 19 is a perspective view illustrating the external appearance of a piezoelectric transducer according to an embodiment. FIG. 20 shows the internal structure of the piezoelectric transducer shown in FIG. 19, showing a piezoelectric oscillation piece from which a lid substrate is removed as viewed from above. FIG. 21 is a cross-sectional view of the piezoelectric transducer take along a line A-A in FIG. 20. FIG. 22 is a perspective view of the disassembled piezoelectric transducer. FIG. 22 does not show the oscillation electrodes 15, the extension electrodes 19 and 20, the mount electrodes 16 and 17, and the weight metal films 21 of the piezoelectric oscillation piece for easy understanding of the figure.

As illustrated in FIGS. 19 through 22, the piezoelectric transducer 1 in this embodiment is a surface mount device piezoelectric transducer 1 which includes a package 9 having laminated two layers of the base substrate 2 and the lid substrate 3, and the piezoelectric oscillation piece 4 accommodated in the cavity C formed inside the package 9.

(Piezoelectric Oscillation Piece)

Figure 23:
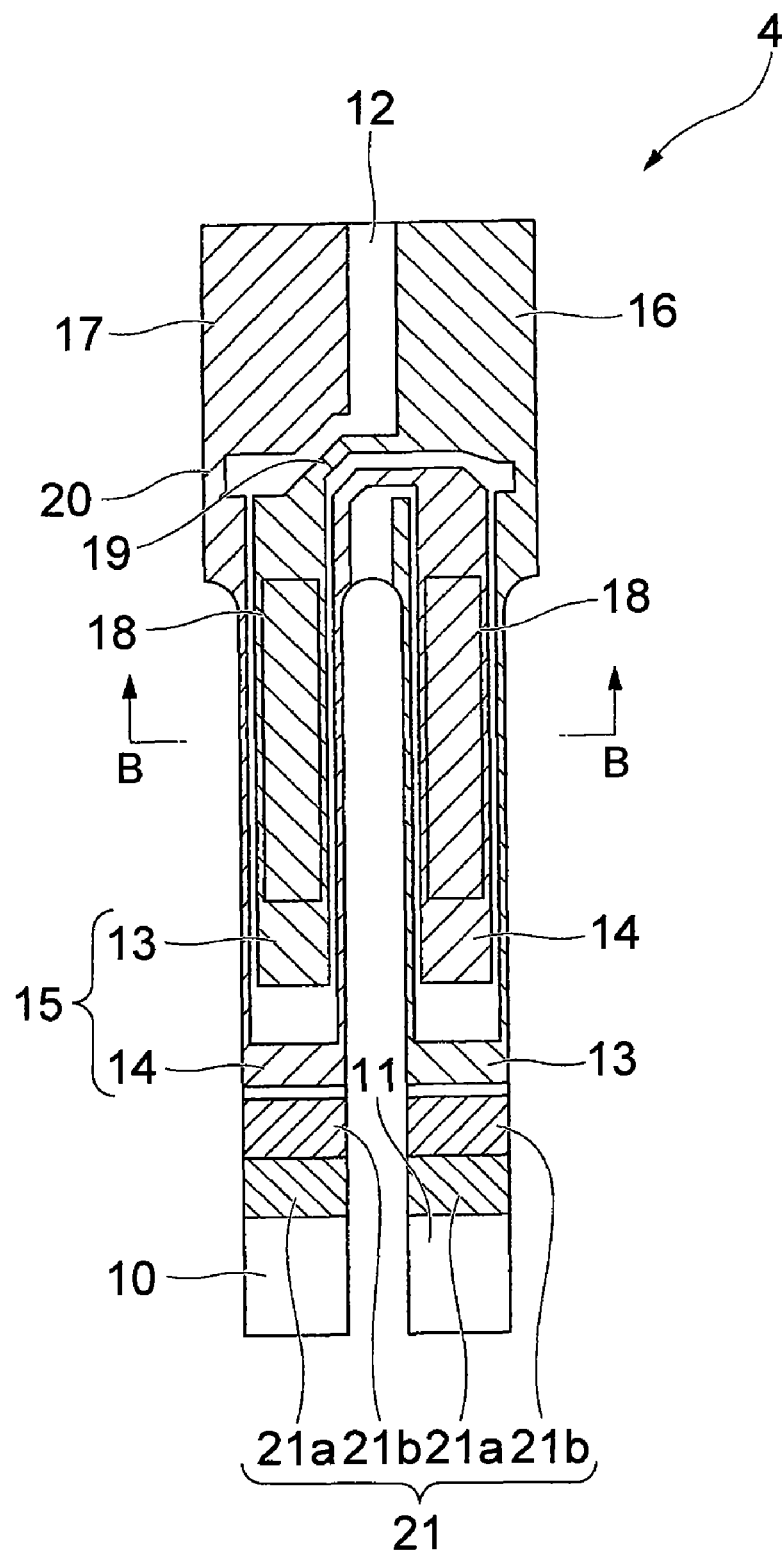
FIG. 23 is a plan view of a piezoelectric oscillation piece constituting the piezoelectric transducer shown in FIG. 19.
Figure 24:
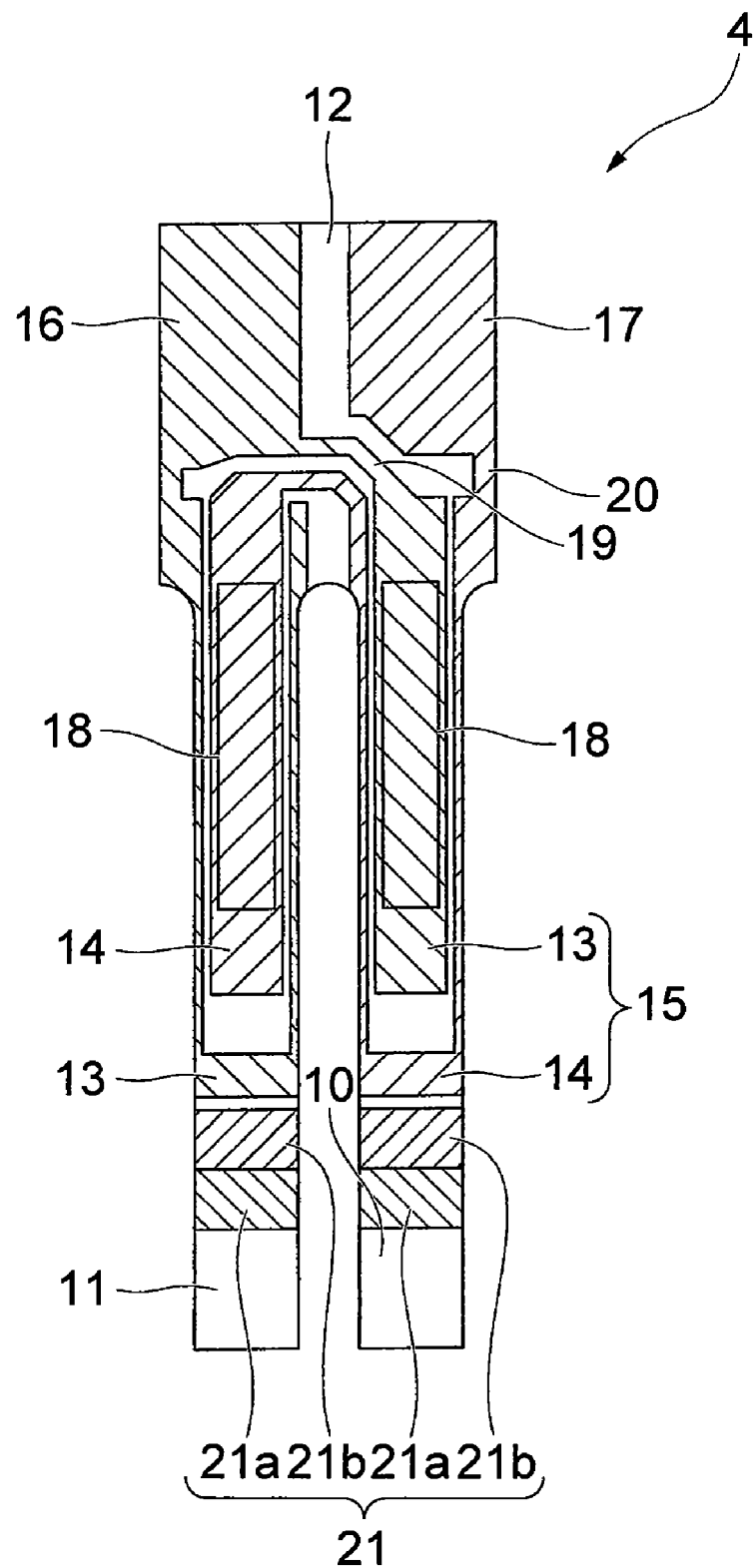
FIG. 24 is a bottom view of the piezoelectric oscillation piece shown in FIG. 23.
Figure 25:
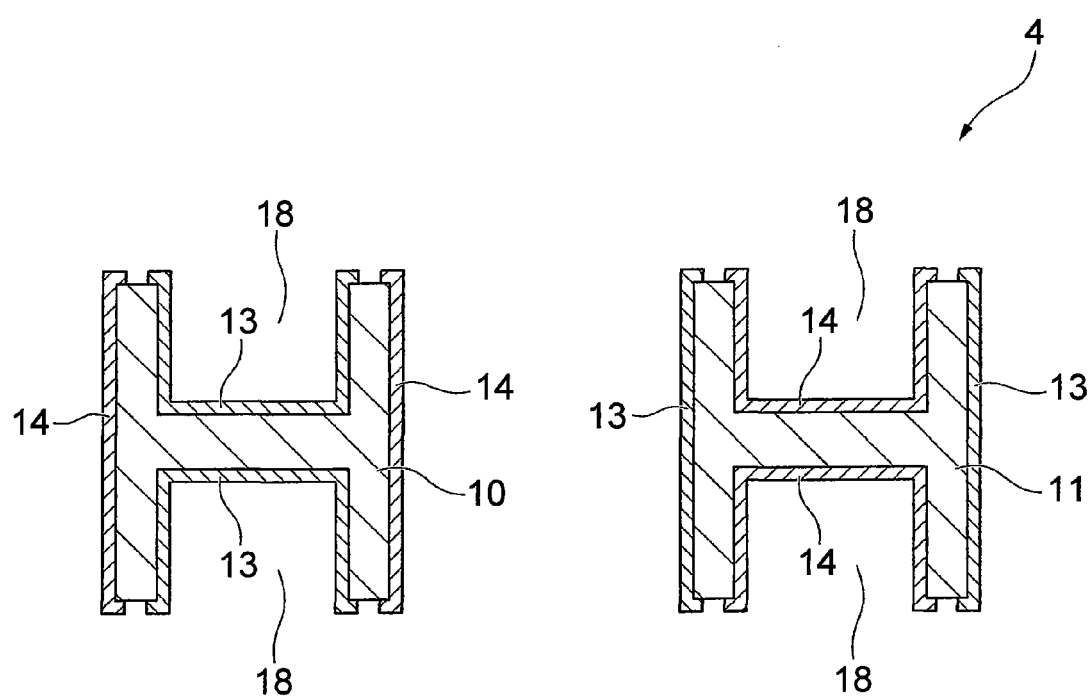
FIG. 25 is a cross-sectional view taken along a line B-B in FIG. 23.

FIG. 23 is a plan view of the piezoelectric oscillation piece. FIG. 24 is a bottom view of the piezoelectric oscillation piece. FIG. 25 is a cross-sectional view taken along a line B-B in FIG. 23.

As illustrated in FIGS. 23 through 25, the piezoelectric oscillation piece 4 is a tuning-fork-type transduction piece made of piezoelectric material such as crystal, lithium tantalate, and lithium niobate, and oscillates when predetermined voltage is applied. The piezoelectric oscillation piece 4 includes a pair of the oscillation arms 10 and 11 disposed in parallel with each other, the base 12 for fixing the base ends of the pair of the oscillation arms 10 and 11 as one unit, the oscillation electrodes 15 each having the first oscillation electrode 13 and the second oscillation electrode 14 provided on the outside surfaces of the pair of the oscillation arms 10 and 11 for oscillating the pair of the oscillation arms 10 and 11, and the mount electrodes 16 and 17 electrically connected with the first oscillation electrode 13 and the second oscillation electrode 14. Moreover, the piezoelectric oscillation piece 4 in this embodiment has the grooves 18 formed on both the main surfaces of the pair of the oscillation arms 10 and 11 in the longitudinal directions of the oscillation arms 10 and 11. The grooves 18 extend from the base ends of the oscillation arms 10 and 11 to approximately the centers of the oscillation arms 10 and 11.

The oscillation electrodes 15 each having the first oscillation electrode 13 and the second oscillation electrode 14 are electrodes for oscillating the pair of the oscillation arms 10 and 11 in directions of moving closer to each other and away from each other at a predetermined resonance frequency, and are patterned on the outside surfaces of the pair of the oscillation arms 10 and 11 while electrically separated from each other. More specifically, the first oscillation electrode 13 is chiefly formed on the groove 18 of the one oscillation arm 10 and both side surfaces of the other oscillation arm 11, and the second oscillation electrode 14 is chiefly formed on both side surfaces of the one oscillation arm 10 and the groove 18 of the other oscillation arm 11.

The first oscillation electrode 13 and the second oscillation electrode 14 are electrically connected with the mount electrodes 16 and 17 via the extension electrodes 19 and 20, respectively, on both main surface of the base 12. Voltage is applied to the piezoelectric oscillation piece 4 via the mount electrodes 16 and 17. The oscillation electrodes 15, the mount electrodes 16 and 17, and the extension electrodes 19 and 20 are formed by conductive film coating such as chrome (Cr), nickel (Ni), aluminum (Al), and titanium (Ti), for example.

The weight metal films (first mass control films) 21 are coated on the tips of the pair of the oscillation arms 10 and 11 for controlling mass such that the oscillation arms 10 and 11 can oscillate within a predetermined frequency range (frequency control). Each of the weight metal films 21 is divided into the rough control film 21a for rough frequency control, and the fine control film 21b for fine frequency control. The frequency of the pair of the oscillation arms 10 and 11 is adjusted to a value lying within the nominal (target) frequency range of the device by performing frequency control using the rough control films 21a and the fine control films 21b.

As illustrated in FIGS. 21 and 22, the piezoelectric oscillation piece 4 having this structure is joined to the upper surface of the base substrate 2 by the bumps B made of gold or the like. More specifically, the pair of the mount electrodes 16 and 17 are connected to the two bumps B provided on the drawing electrodes 36 and 37 (described later) patterned on the upper surface of the base substrate 2 with contact between the mount electrodes 16 and 17 and the two bumps B, respectively. By this method, the piezoelectric oscillation piece 4 is supported with clearance between the piezoelectric oscillation piece 4 and the upper surface of the base substrate 2, and the mount electrodes 16 and 17 are electrically connected respectively with the drawing electrodes 36 and 37.

(Piezoelectric Transducer)

As illustrated in FIGS. 19 through 22, the piezoelectric transducer 1 in this embodiment includes the package 9 having the laminated two layers of the base substrate 2 and the lid substrate 3.

The lid substrate 3 is a transparent insulation substrate made of glass material such as soda lime glass, and is plate-shaped as illustrated in FIGS. 19, 21 and 22. A rectangular recess 3a for accommodating the piezoelectric oscillation piece 4 is formed on the junction surface side of the lid substrate 3 to which the base substrate 2 is joined. The recess 3a is a cavity recess which becomes the cavity C for containing the piezoelectric oscillation piece 4 when both the substrates 2 and 3 are stacked on each other. The lid substrate 3 is joined with the base substrate 2 by anode junction with the recess 3a opposed to the base substrate 2.

The base substrate 2 is a transparent insulation substrate made of glass material such as soda lime glass similarly to the lid substrate 3, and is a plate-shaped component having a size enough to be stacked on the lid substrate 3 as illustrated in FIGS. 19 through 22.

As illustrated in FIGS. 20 and 21, a pair of the through holes 30 and 31 penetrating through the base substrate 2 are formed on the base substrate 2. The pair of the through holes 30 and 31 are formed at both ends on the diagonal of the cavity C. A pair of the through electrodes 32 and 33 are provided on the pair of the through holes 30 and 31 in such a manner as to fill up the through holes 30 and 31. The through electrodes 32 and 33 are constituted by conductive material such as Ag paste. A pair of the external electrodes 38 and 39 electrically connected respectively with the pair of the through electrodes 32 and 33 are provided on the lower surface of the base substrate 2.

As illustrated in FIGS. 20 and 22, the junction film 35 for anode junction and a pair of the drawing electrodes 36 and 37 made of conductive material (such as aluminum) are patterned on the upper surface of the base substrate 2 (junction surface to which the lid substrate 2 is joined). The junction film 35 is provided along the periphery of the base substrate 2 in such a manner as to surround the circumference of the recess 3a formed on the lid substrate 3. The pair of the drawing electrodes 36 and 37 are patterned in such a manner as to electrically connect the one through electrode 32 of the pair of the through electrodes 32 and 33 with the one mount electrode 16 of the piezoelectric oscillation piece 4 and to electrically connect the other through electrode 33 and the other mount electrode 17 of the piezoelectric oscillation piece 4.

For operating the piezoelectric transducer 1 having this structure, predetermined drive voltage is applied to the external electrodes 38 and 39 provided on the base substrate 2. When the drive voltage is applied, current flows in the oscillation electrodes 15 having the first oscillation electrode 13 and the second oscillation electrode 14 provided on the piezoelectric oscillation piece 4. As a result, the pair of the oscillation arms 10 and 11 can oscillate in such directions as to move close to and away from each other at predetermined frequency. Accordingly, the oscillation of the pair of the oscillation arms 10 and 11 can be used for a time source, a control signal timing source, a reference signal source, or for other purposes.

(Getter Member)

As illustrated in FIGS. 20 and 22, the piezoelectric transducer in this embodiment has getter members 70 (second mass control film) inside the cavity. The getter members 70 are activated to adsorb gas around the getter members 70 when laser is applied. The getter members 70 are made of metal such as aluminum (Al), titanium (Ti), and zirconium (Zr), or alloy of these metals. The getter members 70 in this embodiment are made of metal aluminum similar to those of the junction film 35 and the drawing electrodes 36 and 37, and formed on the upper surface of the base substrate 2 simultaneously with formation of the junction film 35 and the drawing electrodes 36 and 37. The getter members 70 may be provided on the inner surface of the cavity recess 3a of the lid substrate 3.

The getter members 70 in this embodiment are disposed in an area adjacent to the weight metal films 21 formed on the oscillation arms 10 and 11 of the piezoelectric oscillation piece 4. More specifically, at least a part of the getter members 70 is disposed in such a position as to overlap with the forming section of the weight metal films 21 in the length direction of the oscillation arms 10 and 11. It is possible to dispose the entire area of the getter members 70 within the forming section of the weight metal films 21 or on the tip side of the oscillation arms 10 and 11 with respect to the forming section of the weight metal films 21 in the length direction of the oscillation arms 10 and 11.

The getter members 70 are disposed at positions to which laser can be applied from the outside of the piezoelectric transducer 1. Since the bottom surface of the recess 3a of the lid substrate 3 is a non-polished surface (ground glass shape) in this embodiment, laser cannot be applied from the outside of the lid substrate 3 (from the upper surface side of the piezoelectric transducer 1). Thus, laser is applied from the outside of the base substrate 2 (from the lower surface side of the piezoelectric transducer 1). For this reason, the getter members 70 are disposed at positions not overlapping with the external electrodes 38 and 39 as viewed from the lower surface side of the piezoelectric transducer 1. Also, the getter members 70 are disposed at positions not overlapping with the weight metal films 21 as viewed from the lower surface side of the piezoelectric transducer 1 so as not to prevent application of laser beam to the weight metal films 21. In this embodiment, the getter members 70, 70 are disposed on both sides of the pair of the oscillation arms 10 and 11 in the width direction as viewed from the lower surface side of the piezoelectric transducer 1.

When laser is applied to the getter members 70, the getter members 70 are evaporated and removed. Since laser is applied to the getter members 70 disposed adjacent to the weight metal films 21 in this embodiment, removal grooves 71 are formed on the getter members at positions close to the weight metal films 21. The removal grooves 71 linearly extend substantially perpendicular to the length direction of the oscillation arms 10 and 11, for example. The plural removal grooves 71 are formed substantially in parallel with each other at approximately equal intervals.

The getter members evaporated by application of laser absorb oxygen inside the cavity to become metal oxide. A part of the metal oxide adheres to the oscillation arms 10 and 11 of the piezoelectric oscillation piece 4. Particularly in this embodiment, laser is applied to the getter members 70 disposed adjacent to the weight metal films 21, and therefore the metal oxide adheres to the oscillation arms 10 and 11 in the forming section of the weight metal films 21 in the length direction of the oscillation arms 10 and 11.

(Piezoelectric Transducer Manufacturing Method)

Figure 26:
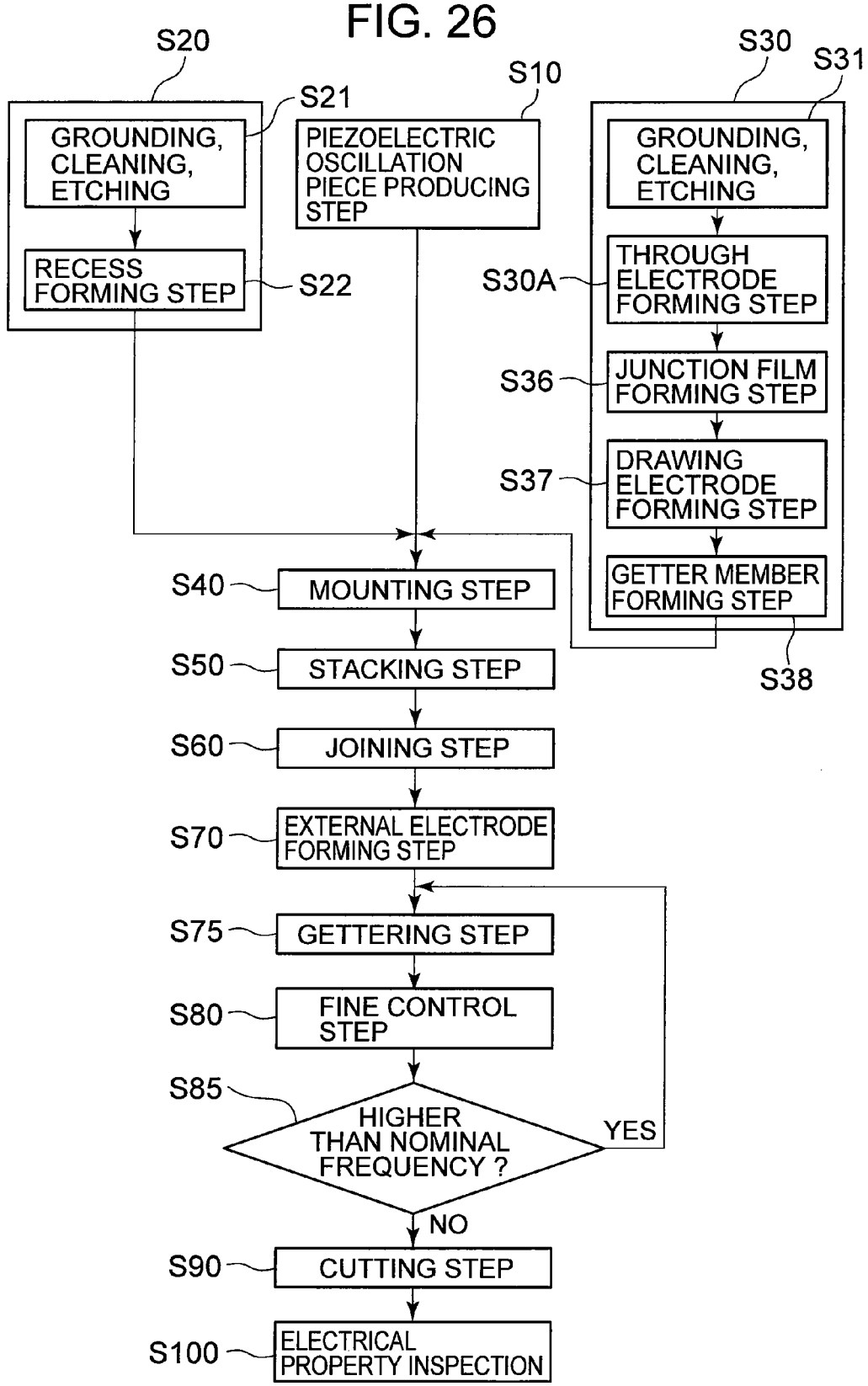
FIG. 26 is a flowchart showing a method for manufacturing the piezoelectric transducer.
Figure 27:
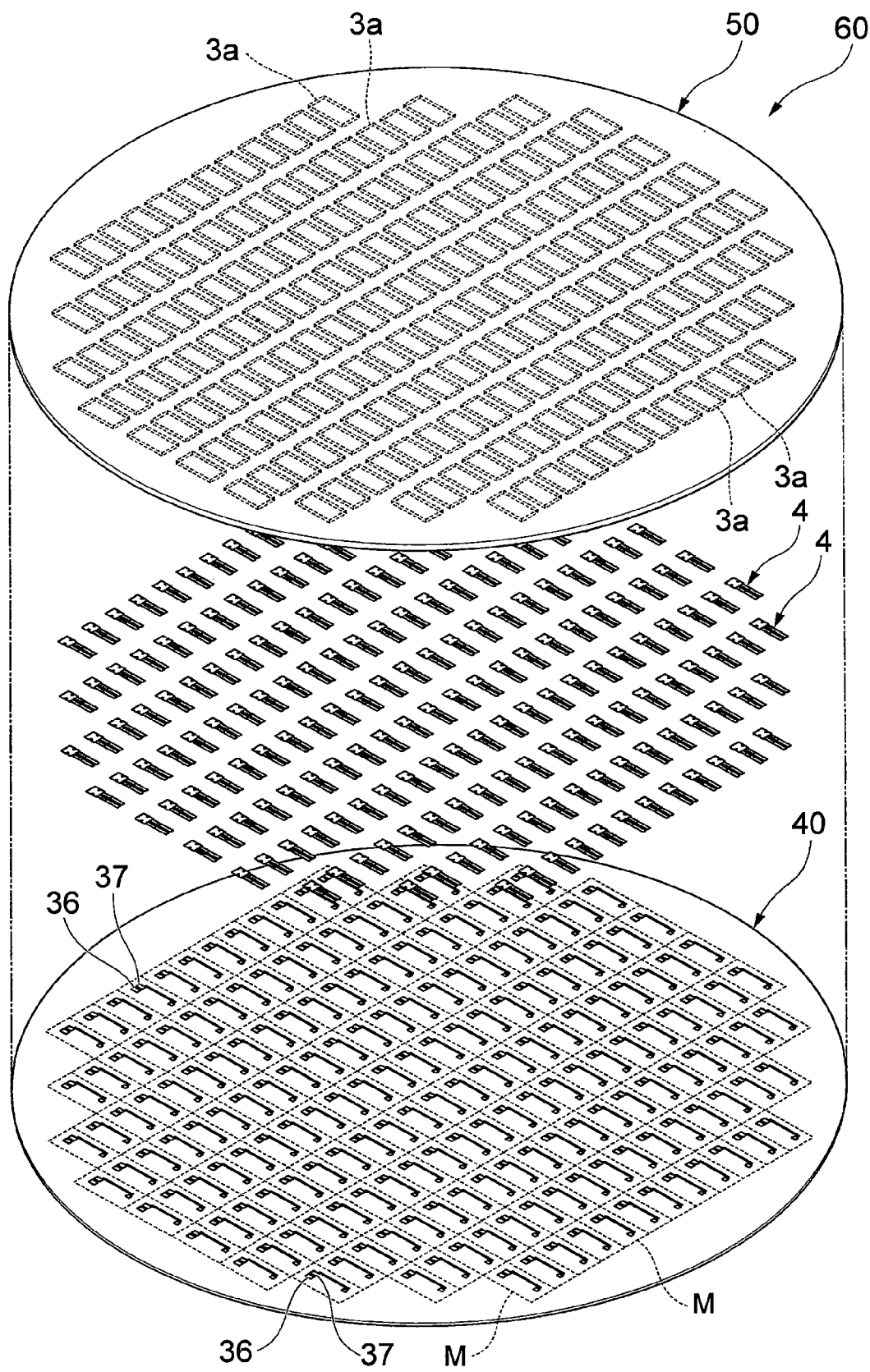
FIG. 27 is a perspective view illustrating a disassembled wafer body having the base substrate wafer and the lid substrate wafer joined by anode junction with the piezoelectric oscillation pieces accommodated in cavities.

FIG. 26 is a flowchart showing the piezoelectric transducer manufacturing method. FIG. 27 illustrates the piezoelectric transducer manufacturing method. FIG. 27 does not show the junction film 35 and the getter members 70 on the base substrate wafer 40 for easy understanding of the figure. The dotted lines M shown in FIG. 27 are cutting lines along which the cutting step is performed later. According to this embodiment, the plural piezoelectric oscillation pieces 4 are disposed between the base substrate wafer 40 and the lid substrate wafer 50 to produce plural piezoelectric transducers at a time.

Initially, a piezoelectric oscillation piece producing step is performed to produce the piezoelectric oscillation piece 4 shown in FIGS. 23 through 25 (S10). After manufacture of the piezoelectric oscillation piece 4, the resonance frequency is roughly controlled. This control is performed by applying laser beam to the rough control films 21a of the weight metal films 21 and evaporating a part of the rough control films 21a to change the weight. The fine control for controlling the resonance frequency with higher accuracy is performed after mounting. This control will be described later.

Then, as illustrated in FIG. 27, a first wafer producing step for producing the lid substrate wafer 50 which finally becomes the lid substrate until the stage immediately before the anode junction is performed (S20). Initially, soda lime glass is ground to have a predetermined thickness and cleaned. Then, the disk-shaped lid substrate wafer 50 from which the processed and affected layer on the outermost surface is removed by etching or other methods is produced (S21). Subsequently, a recess forming step for forming the plural cavity recesses 3a by etching or other methods in the line directions on the junction surface of the lid substrate wafer 50 is performed (S22). In this stage, the first wafer producing step ends.

Then, a second wafer producing step for producing the base substrate wafer 40 which finally becomes the base substrate until the stage immediately before the anode junction is performed simultaneously with or before or after the above step (S30). Initially, soda lime glass is ground to have a predetermined thickness and cleaned. Then, the disk-shaped base substrate wafer 40 from which the processed and affected layer on the outermost surface is removed by etching or other methods is produced (S31). Then, a through electrode forming step for forming plural pairs of the through electrodes 32 and 33 on the base substrate wafer 40 is performed (S30A).

Then, as illustrated in FIG. 22, conductive material is patterned on the upper surface of the base substrate wafer 40 to simultaneously perform a junction film forming step for forming the junction film 35 (S36) and a drawing electrode forming step for forming the drawing electrode 36 and 37 (S37), and a getter member forming step for forming the getter members 70 (S38). A part or all of the junction film forming step (S36), the drawing electrode forming step (S37), and the getter member forming step (S38) may be performed as separate steps in an arbitrary order.

Then, a mount step for joining the produced plural piezoelectric oscillation pieces 4 to the upper surface of the base substrate wafer 40 via the respective drawing electrodes 36 and 37 is performed (S40). First, the bump B made of gold or the like is formed on each of the pair of the drawing electrodes 36 and 37. Then, the base 12 of the piezoelectric oscillation piece 4 is placed on the bumps B, and the piezoelectric oscillation piece 4 is pressed against the bumps B while heating the bumps B at a predetermined temperature. As a result, the piezoelectric oscillation piece 4 is mechanically supported by the bumps B with a clearance between the piezoelectric piece 4 and the upper surface of the base substrate wafer 40, and the mount electrodes 16 and 17 are electrically connected with the drawing electrodes 36 and 37.

After mounting the piezoelectric oscillation piece 4, a stacking step for stacking the lid substrate wafer 50 on the base substrate wafer 40 is performed as illustrated in FIG. 27 (S50). More specifically, both the wafers 40 and 50 are aligned at proper positions using a reference mark or the like (not shown) as index. As a result, the mounted piezoelectric oscillation piece 4 is accommodated in the cavity formed between the wafers 40 and 50.

After the stacking step, the stacked two wafers 40 and 50 are inserted into a not-shown anode junction device to carry out anode junction by applying predetermined voltage in a predetermined temperature atmosphere (S60). More specifically, predetermined voltage is applied between the junction film 35 and the lid substrate wafer 50 shown in FIG. 22. As a result, electrochemical reaction is produced on the interface between the junction film 35 and the lid substrate wafer 50, and the two components are brought into tight contact with each other for anode junction. By this method, the piezoelectric oscillation piece 4 can be sealed into the cavity C, and the wafer body 60 having the base substrate wafer 40 and the lid substrate wafer 50 joined to each other can be produced.

After the end of the anode junction explained above, conductive material is patterned on the lower surface of the base substrate wafer 40 to perform an external electrode forming step for forming plural pairs of the external electrodes 38 and 39 (S70). By this step, the piezoelectric oscillation piece 4 sealed in the cavity C can be operated from the external electrodes 38 and 39 via the through electrodes 32 and 33.

Then, a gettering step for activating the getter members 70 shown in FIG. 22 by applying laser to the getter members 70 is performed (S75). The laser applied to the getter members 70 may be YAG laser or the like similar to that used in a fine control step described later. Since the laser cannot be applied from the outside of the lid substrate wafer 50 as explained above, the laser is applied from the outside of the base substrate wafer 40. The getter members 70 in this embodiment are disposed at positions not overlapping with the external electrodes 38 and 39 as viewed from the outside of the base substrate wafer 40. Thus, laser can be securely applied to the getter members 70. When the getter members 70 (such as Al) are evaporated by application of the laser, the evaporated getter members 70 absorb oxygen inside the cavity and produce metal oxide (such as $Al_2O_3$). As a result, the oxygen inside the cavity is consumed and the degree of vacuum is increased.

Then, a fine control step for fine control over the frequency of each of the piezoelectric transducers 1 sealed inside the cavity C in the condition of the wafer body 60 is performed to adjust the frequency to a value lying within a predetermined range (S80). More specifically, voltage is applied to the pair of the external electrodes 38 and 39 provided on the lower surface of the base substrate wafer 40 to oscillate the piezoelectric oscillation piece 4. Then, laser is applied from the outside of the base substrate wafer 40 while measuring the frequency, and the fine control films 21b of the weight metal films 21 are evaporated and trimmed. Since the getter members 70 are disposed at positions not overlapping with the weight metal films 21 as viewed from the outside of the base substrate wafer 40, laser can be securely applied to the weight metal films 21. By trimming the fine control films 21b through application of laser, the weight of the tip side of the pair of the oscillation arms 10 and 11 decreases. Thus, the frequency of the piezoelectric oscillation piece 4 increases. As a result, fine control for adjusting the frequency of the piezoelectric transducer 1 to a value lying within the predetermined range of the nominal frequency can be achieved.

When the fine control films 21b excessively evaporate by application of laser, the frequency of the piezoelectric transducer 1 exceeds the nominal frequency. It is thus determined whether the frequency of the piezoelectric transducer 1 has exceeded the nominal frequency in S85. When YES, the flow returns to S75 and performs the second gettering step.

In the second gettering step, laser is applied to the getter members 70 disposed adjacent to the weight metal films 21. As a result, the area of the getter members 70 in the vicinity of the weight metal films 21 are evaporated and removed to form the removal grooves 71 on the getter members. The getter members evaporated by laser application absorb oxygen inside the cavity and produce metal oxide through the process of gettering. At least a part of the produced metal oxide adheres to the sides of the tip ends of the oscillation arms 10 and 11 adjacent to the getter members 70 (forming section of the weight metal films 21). As a result, the weight on the tip side of the pair of the oscillation arms 10 and 11 increases, and thus the frequency of the piezoelectric oscillation piece 4 lowers.

Figure 29:
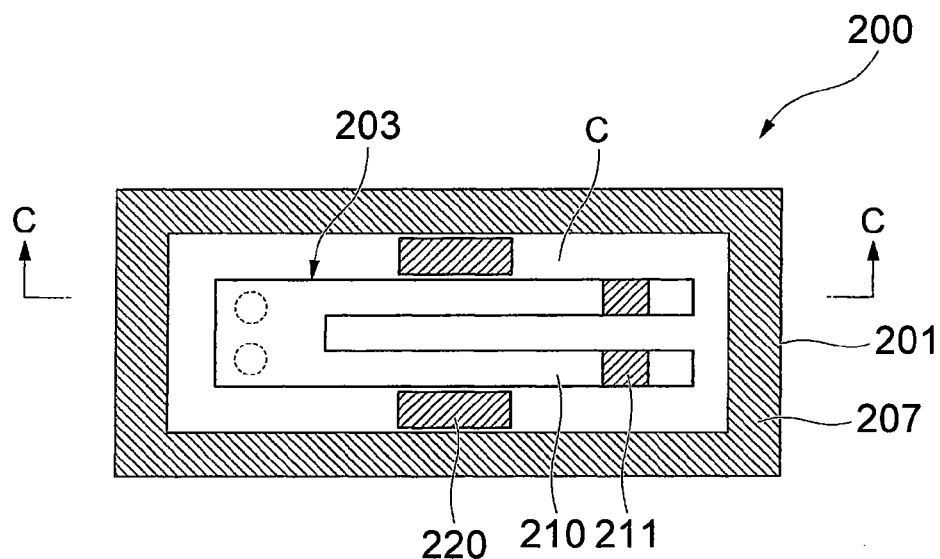
FIG. 29 is a plan view of a piezoelectric transducer in related art from which a lid substrate is removed.
Figure 30:
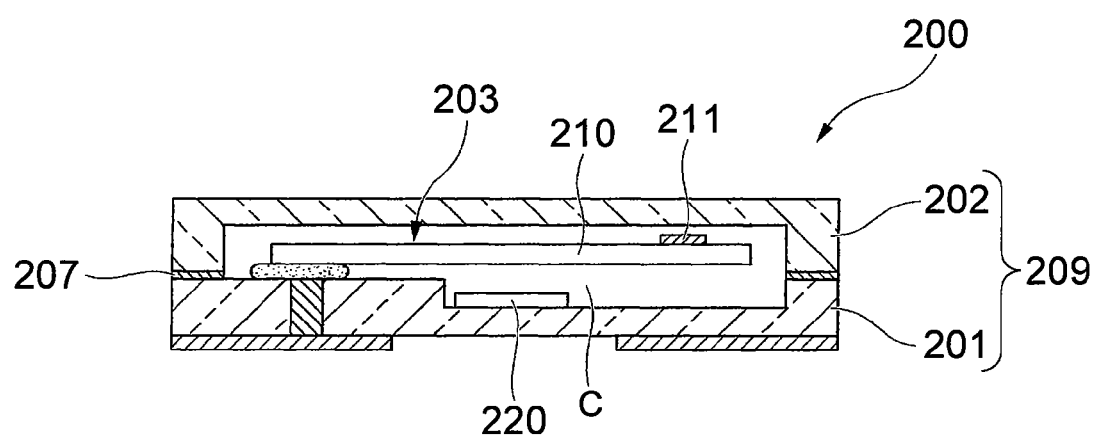
FIG. 30 is a cross-sectional view taken along a line C-C in FIG. 29.

According to the piezoelectric transducer 200 in the related art shown in FIGS. 29 and 30, the getter members 220 are disposed on the base end side of the oscillation arms of the piezoelectric oscillation piece 203. Thus, products by gettering adhere to the base end side of the oscillation arms. In this case, increase in the rigidity of the oscillation arms (corresponding to spring constant in spring-mass system) becomes predominant, and the resonance frequency of the piezoelectric oscillation piece 203 increases.

According to the piezoelectric transducer 1 shown in FIG. 22 in this embodiment, however, the getter members 70 are disposed on the tip side of the oscillation arms 10 and 11 of the piezoelectric oscillation piece 4. Thus, the products by gettering adhere to the tip side of the oscillation arms 10 and 11. In this case, increase in the mass of the oscillation arms 10 and 11 (corresponding to mass in spring-mass system) becomes predominant, and the resonance frequency of the piezoelectric oscillation piece 4 lowers.

FIG. 28 show graphs indicating frequency change during the gettering step. As can be seen from FIG. 28, frequency decreases after gettering. It is considered that the frequency decreases since the metal oxide produced by gettering adheres to the tip side of the oscillation arms 10 and 11 disposed near the metal oxide and increases the weight of the tip side of the oscillation arms 10 and 11.

Figure 28A:
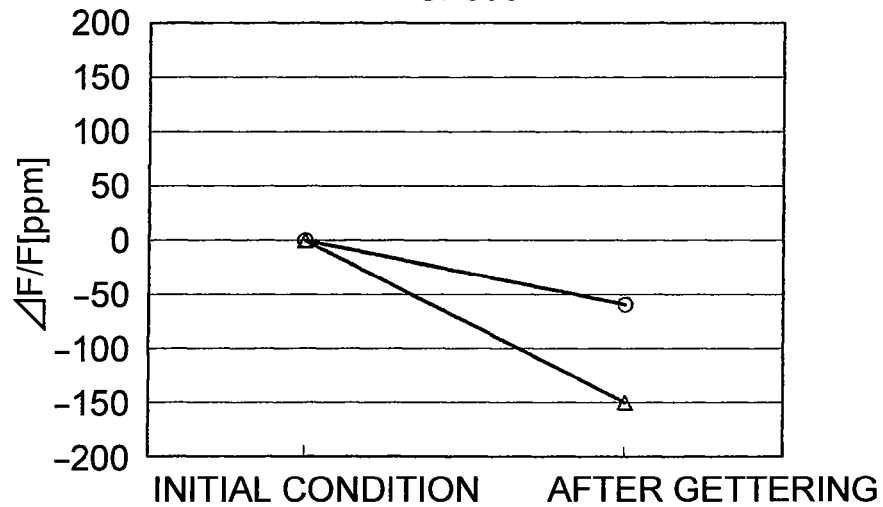
FIG. 28A is a graph showing frequency changes during a gettering step.
Figure 28B:
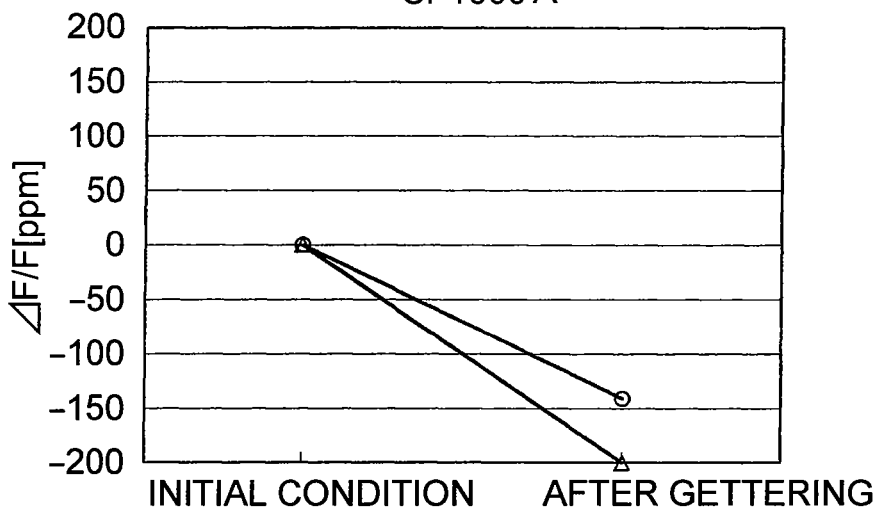
FIG. 28B is a graph showing frequency changes during the gettering step.

FIG. 28A shows the case when the thickness of the getter members is 600 Å, and FIG. 28B shows the case when the thickness is 1000 Å. In the case shown in FIG. 28A, the change rate of the frequency is small (−50 through −150 ppm). In the case shown in FIG. 28B, the change rate of the frequency is large (−150 through −200 ppm). It is thus considered that a larger amount of metal oxide is produced and adheres to the oscillation arms 10 and 11 by gettering as the thickness of the getter members 70 increases. Therefore, the frequency of the piezoelectric transducer can be controlled through a wide range by forming the getter members 70 having a large thickness in advance and varying the application range of laser.

When the frequency of the piezoelectric transducer 1 again becomes lower than the nominal frequency by the second gettering step, the second fine control is performed (S80). The specific method is the same as described above. Since the frequency of the piezoelectric oscillation piece 4 increases by this method, fine control for adjusting the frequency of the piezoelectric transducer 1 to a value lying within the predetermined range of the nominal frequency can be achieved. As a result, it is determined NO in S85, and the flow goes to S90. When the frequency of the piezoelectric transducer 1 is adjusted within the predetermined range of the nominal frequency after completion of the second gettering step, the flow may proceed to S90 without executing the second fine control step.

After the end of the frequency fine control step, the cutting step for cutting the wafer body 60 along the cutting lines M shown in FIG. 27 into small pieces is performed (S90). As a result, the plural two-layer structure surface mount device piezoelectric transducers 1 each of which has the piezoelectric oscillation piece 4 sealed into the cavity C formed between the base substrate 2 and the lid substrate 3 connected by anode junction shown in FIG. 19 can be manufactured at a time. It is possible to perform the gettering step (S75) and the fine control step (S80) after the cutting step (S90) producing the respective small pieces of the piezoelectric transducers 1. However, when gettering and fine control are performed for the wafer body 60 by conducting the gettering step (S75) and the fine control step (S80) prior to the cutting step (S90) as explained above, the plural electric transducers 1 can be manufactured with higher efficiency. Accordingly, this method is more preferable in view of higher throughput.

Then, electrical property inspection of the piezoelectric oscillation piece 4 is performed (S100). More specifically, the resonance frequency, the resonance resistance, the drive level property (oscillation power dependences of resonance frequency and resonance resistance) and the like of the piezoelectric oscillation piece 4 is measured and checked. Also, insulation resistance property and the like are checked. Then, the external appearance of the piezoelectric transducer 1 is finally inspected for the final check of the dimensions, quality and the like. By this step, manufacture of the piezoelectric transducer 1 ends.

As described above in detail, the piezoelectric transducer manufacturing method according to this embodiment has the step for reducing frequency of the piezoelectric oscillation piece 4 by removing at least a part of the getter members 70 adjacent to the weight metal films 21.

Generally, the frequency of the piezoelectric oscillation piece 4 increases by trimming the weight metal films 21. Thus, when substances adhere to the forming section of the weight metal films 21, the frequency of the piezoelectric oscillation piece 4 lowers. According to this embodiment, the area of the getter members 70 adjacent to the weight metal films 21 is removed. Thus, the products by gettering adhere to the forming section of the weight metal films 21, and the frequency of the piezoelectric oscillation piece 4 can be decreased. Accordingly, even when the frequency of the piezoelectric transducer 1 exceeds the nominal frequency by excessive trimming of the weight metal films 21, the frequency of the piezoelectric transducer 1 can be adjusted to a value lying within the predetermined range of the nominal frequency by gettering. Thus, the yield of the piezoelectric transducer can improve.

[Oscillator]

An oscillator according to an embodiment of the invention is now discussed with reference to FIG. 15.

Figure 15:
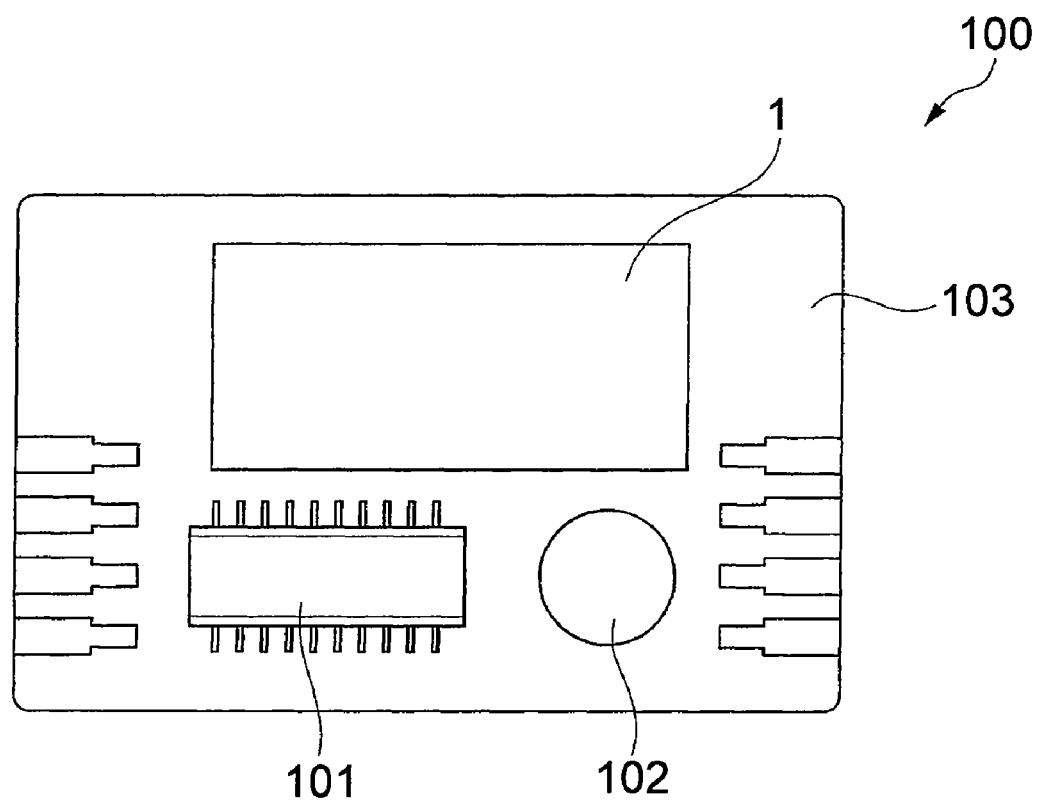
FIG. 15 illustrates a structure of an oscillator according to an embodiment of the invention.

As illustrated in FIG. 15, an oscillator 100 in this embodiment includes the piezoelectric transducer 1 as an oscillation unit electrically connected with an integrated circuit 101. The oscillator 100 has a substrate 103 on which an electronic component 102 such as capacitors is mounted. The integrated circuit 101 for oscillator is mounted on the substrate 103, and the piezoelectric transducer 1 is mounted in the vicinity of the integrated circuit 101. The electronic component 102, the integrated circuit 101, and the piezoelectric transducer 1 are electrically connected with one another by a not-shown wiring pattern. The respective components are molded from not-shown resin.

According to the oscillator 100 having this structure, the piezoelectric oscillation piece 4 within the piezoelectric transducer 1 oscillates when voltage is applied to the piezoelectric transducer 1. This oscillation is converted into electric signals by the piezoelectric property of the piezoelectric oscillation piece 4, and inputted to the integrated circuit 101 as electric signals. The inputted electric signals are processed in various ways by the integrated circuit 101 and outputted as frequency signals. Thus, the piezoelectric transducer 1 functions as oscillator.

When an RTC (real time clock) module or the like is selectively established in the structure of the integrated circuit 101 as required, functions such as controlling the operation date and time of the oscillator or an external device and providing time, calendar and the like can be added to the single-function oscillator for clock.

The oscillator 100 in this embodiment includes the piezoelectric transducer 1 which has quality increased by performing frequency fine control with higher accuracy while reducing accumulation of heating loads and achieves cost reduction by conducting gettering and fine control with high efficiency. Thus, the operation reliability and quality of the oscillator 100 can be improved accordingly. Moreover, highly accurate frequency signals stabilized for a long period can be obtained.

Furthermore, cost reduction of the oscillator 100 can be achieved by including the piezoelectric transducer 1 having improved yield.

[Electronic Device]

Figure 16:
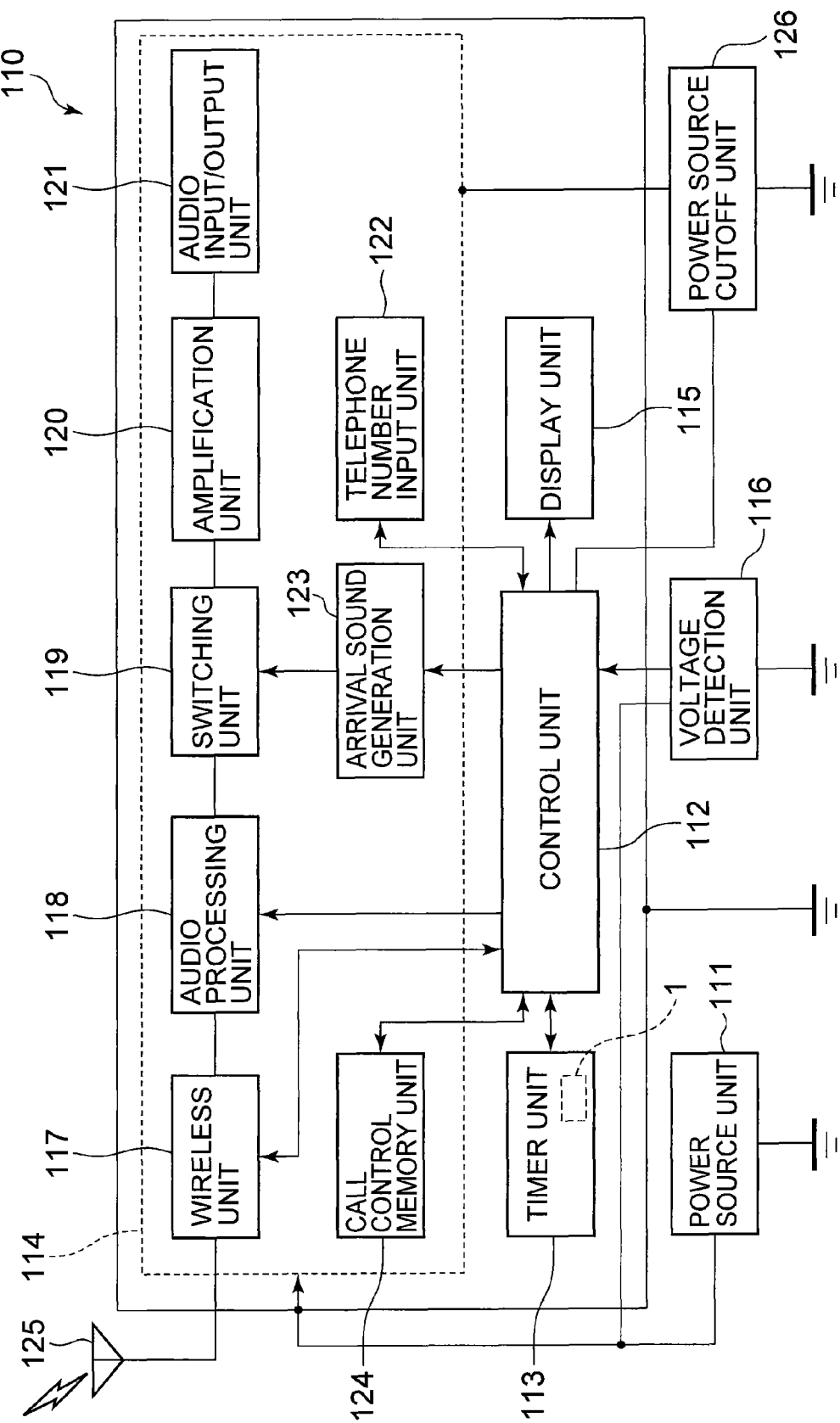
FIG. 16 shows a structure of an electronic device according to an embodiment of the invention.

An electronic device according to an embodiment of the invention is now described with reference to FIG. 16. A portable information device 110 including the piezoelectric transducer 1 described above is herein discussed as an example of the electronic device. A typical example of the portable information device 110 in this embodiment is a cellular phone developed and improved from a wrist watch in related art. The external appearance of the portable information device 110 is similar to that of a watch, and has a liquid crystal display on an area corresponding to a dial such that current time and the like can be displayed on the screen of the display. When used as a communication device, the portable information device 110 is removed from the wrist to provide communication similar to that of the related-art cellular phone via a speaker and a microphone disposed inside the band. However, the portable information device 110 is considerably small-sized and lightweight compared with the related-art cellular phone.

The structure of the portable information device 110 in this embodiment is now discussed. As illustrated in FIG. 16, the portable information device 110 includes the piezoelectric transducer 1, and a power source unit 111 for supplying power. The power source unit 111 has a lithium secondary battery, for example. The power source unit 111 connects with a control unit 112 for performing various controls, a timer unit 113 for counting time and the like, a communication unit 114 for providing communication with the outside, a display unit 115 for displaying various information, and a voltage detection unit 116 for detecting voltages of the respective function units in parallel such that power can be supplied from the power source unit 111 to the respective function units.

The control unit 112 controls the overall operation of the system such as transmission and reception of audio data, and measurement and display of current time by controlling the respective function units. The control unit 112 has a ROM to which programs have been written, a CPU for reading and performing the programs written to the ROM, a RAM used as work area of the CPU, and others.

The timer unit 113 has an integrated circuit containing an oscillation circuit, a register circuit, a counter circuit, an interface circuit and others, and the piezoelectric transducer 1. When voltage is applied to the piezoelectric transducer 1 to oscillate the piezoelectric oscillation piece 4, this oscillation is converted into electric signals by the piezoelectric property of crystal and inputted to the oscillation circuit as electric signals. The output from the oscillation circuit is converted into binary values and counted by the register circuit and the counter circuit. Then, the signals are transmitted to and received from the control unit 112 via the interface circuit to display current time and current date, calendar information and the like on the display unit 115.

The communication unit 114 has function similar to that of the related-art cellular phone, and includes a wireless unit 117, an audio processing unit 118, a switching unit 119, an amplification unit 120, an audio input/output unit 121, a telephone number input unit 122, an arrival sound generation unit 123, and a call control memory unit 124.

The wireless unit 117 transmits and receives various data such as audio data to and from a base station via an antenna 125. The audio processing unit 118 encodes and combines audio signals inputted from the wireless unit 117 or the amplification unit 120. The amplification unit 120 amplifies the signals inputted from the audio processing unit 118 or the audio input/output unit 121 to a predetermined level. The audio input/output unit 121 has a speaker, a microphone and the like to increase the level of arrival sound or audio received by the receiver and collect audio.

The arrival sound generation unit 123 produces arrival sound in response to a call from the base station. The switching unit 119 switches the amplification unit 120 connected with the audio processing unit 118 to the arrival sound generation unit 123 only at the time of reception to output the arrival sound generated by the arrival sound generation unit 123 to the audio input/output unit 121 via the amplification unit 120.

The call control memory unit 124 stores programs associated with transmission and reception call control of communication. The telephone number input unit 122 has 0 through 9 number keys and other keys, for example, and inputs the telephone number of the telephone with which communication is desired by press of the number keys and the like.

The voltage detection unit 116 detects voltage decrease when voltage applied to the respective function units such as the control unit 112 from the power source unit 111 becomes lower than a predetermined value, and notifies the control unit 112 about the detected voltage decrease. The predetermined voltage in this case is the minimum voltage necessary for stable operation of the communication unit 114 set in advance, such as about 3V. The control unit 112 having received notification about the voltage decrease from the voltage detection unit 116 suspends operation of the wireless unit 117, the audio processing unit 118, the switching unit 119, and the arrival sound generation unit 123. Particularly, the operation stop of the wireless unit 117 which requires large power consumption is essential. Also, the impossibility of using the communication unit 114 due to the insufficient remaining volume of the battery is displayed on the display unit 115.

Thus, the operation of the communication unit 114 is suspended by the voltage detection unit 116 and the control unit 112, and this condition is notified through display on the display unit 115. This display may be a message by characters, or indicated by a x mark on telephone icon displayed on the upper region of the display surface of the display unit 115 as more intuitive display.

The function of the communication unit 114 can be securely stopped by providing a power source cutoff unit 126 for selectively cutting the power source associated with the function of the communication unit 114.

As described above, the portable information device 110 in this embodiment includes the piezoelectric transducer 1 which has quality improved by performing frequency fine control with higher accuracy while decreasing accumulation of heating load and achieves cost reduction by executing gettering and fine control with high efficiency. Thus, the operation reliability and quality of the portable information device 110 can be improved accordingly. In addition, highly accurate time information stabilized for a long period can be displayed.

Moreover, cost reduction of the portable information device 110 can be achieved by including the piezoelectric transducer 1 having higher yield.

[Radio Clock]

A radio clock according to an embodiment of the invention is hereinafter described with reference to FIG. 17.

Figure 17:
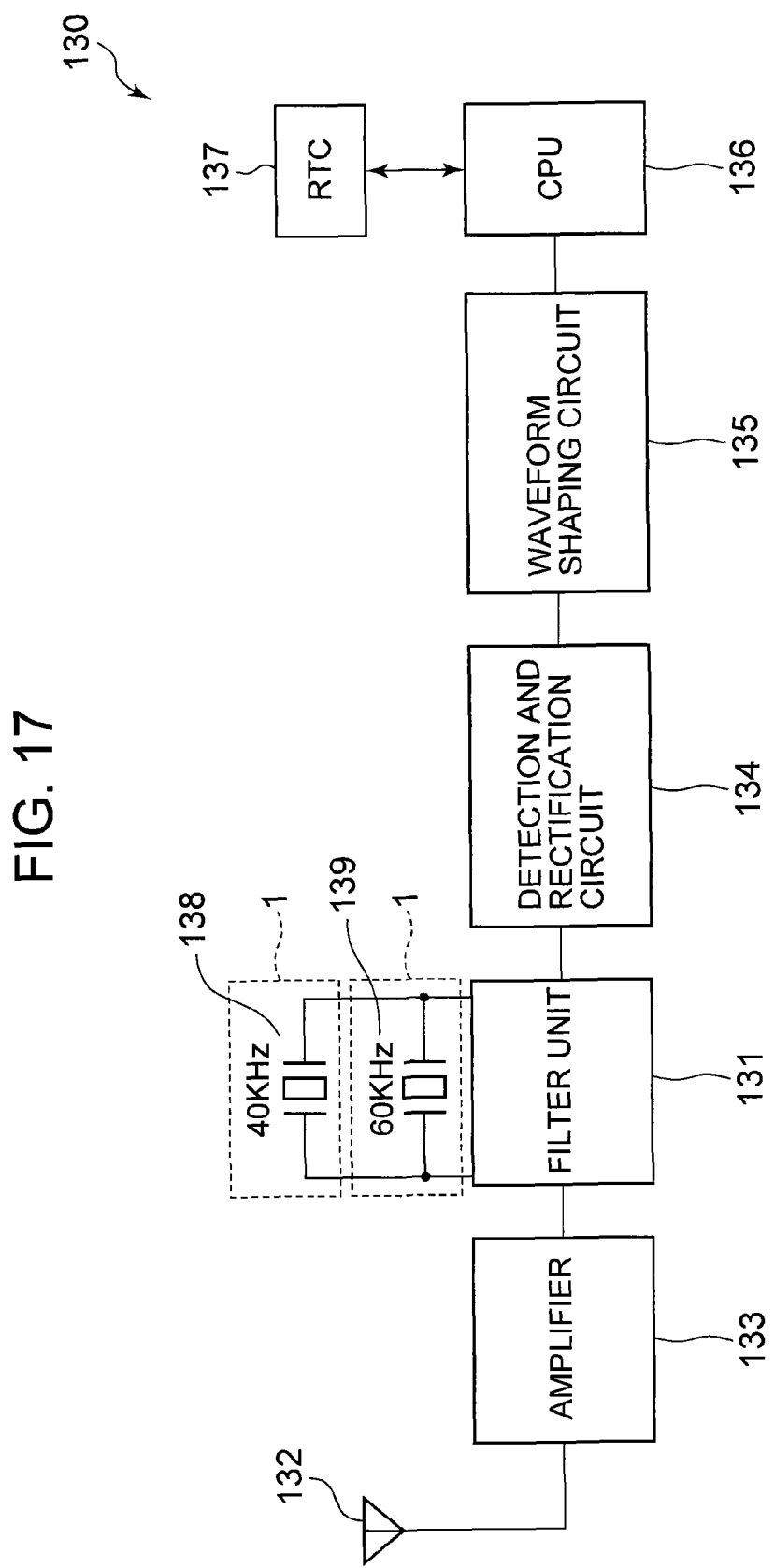
FIG. 17 shows a structure of a radio clock according to an embodiment of the invention.

As shown in FIG. 17, a radio clock 130 in this embodiment includes the piezoelectric transducers 1 electrically connected with a filter unit 131 as a clock which has functions of receiving standard waves containing time information and displaying time after automatic correction to accurate time.

There are domestic transmission points (transmission stations) for transmitting standard waves in Fukushima Prefecture (40 kHz) and Saga Prefecture (60 kHz) in Japan, each of which transmits standard waves. The long waves such as 40 kHz and 60 kHz have both characteristics of transmitting along the surface of the earth and transmitting while reflecting on the ionized layer and the surface of the earth. Thus, the transmission range is wide enough to cover all areas in Japan by the above two transmission points.

The details of the function structure of the radio clock 130 are herein explained.

An antenna 132 receives long standard waves of 40 kHz or 60 kHz. The long standard waves are produced by converting time information called time codes into carrier waves of 40 kHz or 60 kHz by AM modulation. The received long standard waves are amplified by an amplifier 133, and filtered and tuned by the filter unit 131 having the plural piezoelectric transducer 1.

The piezoelectric transducers 1 in this embodiment have crystal oscillator units 138 and 139 having resonance frequencies of 40 kHz and 60 kHz, respectively, equivalent to the carrier frequencies described above.

The filtered signals having the predetermined frequencies are detected and demodulated by a detection and rectification circuit 134.

Then, time codes are extracted via a waveform shaping circuit 135 and counted by a CPU 136. The CPU 136 reads information such as current year, cumulative date, day, and time. The read information is reflected on an RTC 137 to display accurate time information.

Since the carrier waves are 40 kHz or 60 kHz, it is preferable that the crystal oscillator units 138 and 139 contain oscillators having the tuning-fork type structure described above.

While the domestic case in Japan has been discussed as an example, frequencies of long standard waves vary for each country outside Japan. For example, standard waves of 77.5 kHz are used in Germany. Thus, for incorporating the radio clock 130 usable in other countries in a portable device, the piezoelectric transducer 1 having frequencies different from those for Japan is further required.

As described above, the radio clock 130 in this embodiment includes the piezoelectric transducer 1 which has quality improved by performing frequency fine control with higher accuracy while decreasing accumulation of heating load and achieves cost reduction by executing gettering and fine control with high efficiency. Thus, the operation reliability and quality of the radio clock 130 can be improved accordingly. In addition, highly accurate time can be counted in a stable manner for a long period.

Moreover, cost reduction of the radio clock 130 can be achieved by including the piezoelectric transducer 1 having higher yield.

The technical scope of the invention is not limited to the embodiments described herein. Various modifications and changes may be made without departing from the scope of the invention.

For example, while the piezoelectric transducer 1 in the embodiments is the two-layer structure type surface mount device piezoelectric transducer 1, the piezoelectric transducer may be a three-layer structure type. More specifically, a piezoelectric transducer plate having a frame-shaped portion for surrounding the periphery of the piezoelectric oscillation piece 4 is mounted on the upper surface of the base substrate 2, and the base substrate 2 and the lid substrate 3 are joined via the piezoelectric transducer plate. Then, the piezoelectric oscillation piece 4 is sealed into the cavity to produce the piezoelectric transducer.

According to the embodiments, the fine control films 21b formed as the weight metal films 21 are heated in the fine control step. However, the oscillation electrodes 15 may be extended to the vicinity of the rough control films 21a on the tip side of the pair of the oscillation arms 10 and 11, and a part of the oscillation electrodes 15 may be heated in the fine control step. In this case, the part of the oscillation electrodes 15 functions as the weight metal films 21.

According to the embodiments, the getter members 34 are provided on the base substrate 2. However, the getter members 34 may be disposed at least either on the base substrate 2 or on the lid substrate 3. That is, the getter members 34 may be formed on the lid substrate 3 or on both the substrates 2 and 3.

While the piezoelectric oscillation piece 4 has the grooves 18 on both surfaces of the oscillation arms 10 and 11 as an example of the piezoelectric oscillation piece 4, the piezoelectric oscillation piece need not have the grooves 18. However, the electric field efficiency between the pair of the oscillation electrodes 15 produced when predetermined voltage is applied to the oscillation electrodes 15 can be increased by providing the grooves 18, and the oscillation characteristics can be further improved by reduction of oscillation loss. That is, a CI (crystal impedance) value can be further decreased, and the performance of the piezoelectric oscillation piece 4 can be further raised. Thus, it is preferable that the grooves 18 are provided in this aspect.

While the pair of the through electrodes 33 and 34 are provided in the embodiments, the through electrodes 33 and 34 may be eliminated. However, in the manufacture of the piezoelectric transducers 1 from a wafer, the individual piezoelectric oscillation pieces 4 can be oscillated in the form of wafer by providing the through electrodes 33 and 34. In this case, the gettering step and the fine control step can be performed before cutting into small pieces. It is thus preferable that the through electrodes 33 and 34 are provided.

The technical scope of the invention is not limited to the embodiments described herein but includes various modifications and changes without departing from the scope of the invention. That is, the specific materials, layer structures and others described in the embodiments are only examples, and may be changed as necessary.

For example, while the frequency is controlled by removing a part of the getter members 70 in the embodiments, the frequency may be controlled by removing a part of a second mass control film disposed adjacent to the weight metal films 21 as a film different from the getter members 70. However, the necessity for forming the additional second mass control film is eliminated by using the getter members 70 as the second mass control film as in the embodiment. In this case, the cost of the piezoelectric transducer can be reduced.

According to the embodiments, the getter members 70 and the junction film 35 are formed on the surface of the base substrate 2. However, the getter members 70 and the junction film 35 may be disposed on the surface of the lid substrate 3. However, the getter members 70 and the junction film 35 can be formed simultaneously with the formation of the drawing electrodes 36 and 37 by disposing the getter members 70 and the junction film 35 on the base substrate. In this case, simplification of the manufacture process and reduction of the manufacture cost can be achieved.

While the base substrate 2 and the lid substrate 3 are connected via the junction film 35 by anode junction in the embodiments, the connecting method is not limited to anode junction. However, anode junction is preferable due to firm connection between both the substrates 2 and 3 by anode junction.

While the piezoelectric oscillation piece 4 is connected by bumps in the embodiments, the connecting method is not limited to bump connection. For example, the piezoelectric oscillation piece 4 may be joined by a conductive adhesive. In case of bump connection, however, the piezoelectric oscillation piece 4 can be disposed on the upper surface of the base substrate 2 with a clearance between the piezoelectric oscillation piece 4 and the upper surface. In this case, the minimum oscillation gap necessary for oscillation can be automatically secured. It is thus preferable that the piezoelectric oscillation piece 4 is connected by bump connection.

EXAMPLE

Figure 18:
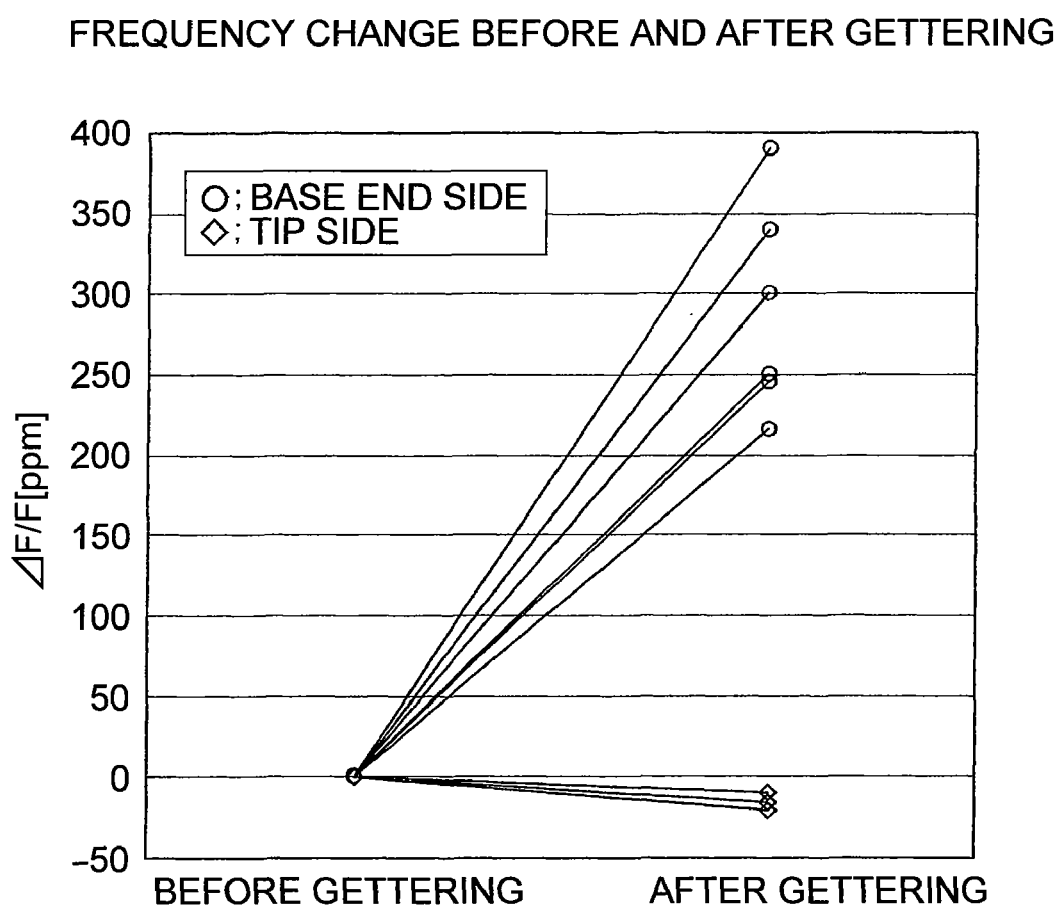
FIG. 18 shows a result of an example performed by using the piezoelectric transducer according to the invention.

FIG. 18 shows frequency change which varies according to the heating position of the getter members 34 as an actually measured result according to the piezoelectric transducer 1 of the invention.

In measurement, the wafer body 60 in the first embodiment was used, and the getter members 34 were heated by using laser in the gettering step. In this case, measurement was conducted for two patterns of the heating position on the getter members 34. The first pattern is that the getter members 34 were heated throughout the areas from approximately the center in the longitudinal direction of the getter members 34 to the base end side of the oscillation arms 10 and 11 (hereinafter referred to as base-gettering). The second pattern is that the getter members 34 were heated throughout the areas from approximately the center in the longitudinal direction of the getter members 34 to the tip side of the oscillation arms 10 and 11 (hereinafter referred to as tip-gettering). In this example, the getter members 34 are heated in excess of the necessary amount for controlling the degree of vacuum to recognize the frequency change more clearly.

Then, frequencies of 6 base-gettering samples and 3 tip-gettering samples were measured before and after gettering for each.

FIG. 18 is a graph on which measurement results of base-gettering samples (legend: base O) and tip-gettering samples (legend: tip ◊) were plotted with the vertical axis indicating frequency changes after gettering with respect to frequency before gettering ($\Delta F/F$[ppm]).

According to the results, considerable increase in frequencies of the base-gettering samples after gettering from those before gettering was confirmed. Also, decrease in frequencies of the tip-gettering samples after gettering from those before gettering was confirmed.

As can be seen, it was confirmed that frequency changes by heating the getter members 34 used in the gettering step. It was also confirmed that frequency increases by heating the base side of the getter members 34 and decreases by heating the tip side. It was therefore clarified that frequency control can be performed by determining the heating position of the getter members 34 according to the difference between the approximate range and the measured frequency as well as gettering.

According to the invention, the surface mount device piezoelectric transducer which has quality improved by fine frequency control with higher accuracy while decreasing accumulation of heating load and achieves cost reduction by performing gettering and fine control with high efficiency can be provided.

The piezoelectric transducer manufacturing method according to the invention can manufacture the piezoelectric transducer described above.

According to the piezoelectric transducer manufacturing method of the invention, the frequency of the piezoelectric oscillation piece can be lowered by removing the second mass control film. By this method, the frequency of the piezoelectric transducer can be adjusted to a value lying within the target range by removing the second mass control film even when the frequency of the piezoelectric transducer exceeds the target range by excessive removal of the first mass control film. Thus, the yield of the piezoelectric transducer can be improved.

Moreover, quality improvement and cost reduction of the oscillator, the electronic device, and the radio clock according to the invention can be similarly achieved by including the piezoelectric transducer described above.

The invention claimed is:

1. A piezoelectric transducer, comprising:
   a piezoelectric oscillation piece which has a pair of oscillation arms disposed in parallel with each other, base ends of which are fixed to a base of the piezoelectric oscillation piece, and has weight metal films formed near tips of the oscillation arms;
   a base substrate on an upper surface of which the piezoelectric oscillation piece is mounted;
   a lid substrate joined with the base substrate such that the mounted piezoelectric oscillation piece is accommodated in a cavity; and
   a control film disposed on one of the substrates to increase a degree of vacuum inside the cavity when heated, the control film being extensive adjacent to one of the oscillation arms, as viewed in a plan view, from a side of the base end to a side of the tip in a longitudinal direction of the oscillation arms,
   wherein the control film is so disposed with respect to the one oscillation arm that when heated a part of the control film is deposited locally on a side surface of the one oscillation arm adjacent to the control film.

2. The piezoelectric transducer according to claim 1, wherein the control film is disposed between the pair of the oscillation arms, as viewed in the plan view.

3. An oscillator comprising the piezoelectric transducer according to claim 1 electrically connected with an integrated circuit as oscillation unit.

4. An electronic device comprising the piezoelectric transducer according to claim 1 electrically connected with a timer unit.

5. A radio clock comprising the piezoelectric transducer according to claim 1 electrically connected with a filter unit.

6. A piezoelectric transducer, comprising:
   a tuning-fork type piezoelectric oscillation piece which has a pair of oscillation arms;
   a package which contains the piezoelectric oscillation piece;
   a first mass control film formed on the oscillation arms, wherein a part of a first mass control film is removable to increase a frequency of the piezoelectric oscillation piece; and
   a second mass control film on an inside surface of the package adjacent to the first mass control film, wherein at least a part of the second mass control film is removed in an area adjacent to the first mass control film.

7. The piezoelectric transducer according to claim 6, wherein at least a part of the removed second mass control film is deposited on a section of the oscillation arms extensive in a length direction of the oscillation arms, where the first mass control film is formed.

8. The piezoelectric transducer according to claim 6, wherein the second mass control film comprises a getter material.

9. An oscillator comprising the piezoelectric transducer according to claim 6 electrically connected with an integrated circuit as oscillation unit.

10. An electronic device comprising the piezoelectric transducer according to claim 6 electrically connected with a timer unit.

11. A radio clock comprising the piezoelectric transducer according to claim 6 electrically connected with a filter unit.

12. A piezoelectric transducer manufacturing method for manufacturing a piezoelectric transducer which comprises:
   a piezoelectric oscillation piece having a pair of oscillation arms disposed in parallel with each other, base ends of which are fixed to a base of the piezoelectric oscillation piece, and having weight metal films formed near tips of the oscillation arms;
   a base substrate on an upper surface of which the piezoelectric oscillation piece is mounted;
   a lid substrate joined with the base substrate such that the mounted piezoelectric oscillation piece is accommodated in a cavity; and
   a control film disposed on one of the substrates to increase a degree of vacuum inside the cavity when heated, the control film being extensive adjacent to one of the oscillation arms, as viewed in a plan view, from a side of the base end to a side of the tip side in a longitudinal direction of the oscillation arms,
   the method comprising:
      a control film forming step of forming the control film on at least one of the base substrate and the lid substrate;
      a joining step of joining the base substrate and the lid substrate, after mounting the piezoelectric oscillation piece on the upper surface of the base substrate, to seal the piezoelectric oscillation piece into the cavity;
      a gettering step of locally heating and evaporating the control film, while measuring series resonance resistance and a frequency after oscillating the piezoelectric oscillation piece sealed in the cavity, to adjust a degree of vacuum inside the cavity to a certain level or higher and adjusting the frequency to a value lying within an approximate range around a target value; and
      a fine control step of performing fine control of the frequency within the approximate range by heating the weight metal films while continuously measuring the frequency to adjust the frequency to a value close to the target value,
   wherein
      in the gettering step, a location to be heated in the control film is determined according to a difference between the approximate range and the measured frequency, and
      oscillation characteristics are changed by locally depositing the heated control film on side surfaces of the oscillation arms positioned adjacent to the location to be heated in the control film.

13. The piezoelectric transducer manufacturing method according to claim 12, wherein the control film is formed between the pair of the oscillation arms, as viewed in the plan view, in the control film forming step.

14. A piezoelectric transducer manufacturing method for manufacturing a piezoelectric transducer which comprises a tuning-fork type piezoelectric oscillation piece having a pair of oscillation arms, a package containing the piezoelectric oscillation piece, and a first mass control film formed on the oscillation arms a part of which is removable to increase a frequency of the piezoelectric oscillation piece, wherein a second mass control film is formed on an inside surface of the package adjacent to the first mass control film,
   the method further comprising a step for decreasing the frequency of the piezoelectric oscillation piece by removing at least a part of the second mass control film in an area adjacent to the first mass control film.

15. The piezoelectric transducer manufacturing method according to claim 14, wherein removing at least a part of the second mass control film comprises applying laser from outside the package.

16. The piezoelectric transducer manufacturing method according to claim 14, further comprising joining a pair of substrates to form the package through anode junction via a junction film; and
   simultaneously forming the junction film and the second mass control film.

* * * * *